United States Patent
Haw

(10) Patent No.: US 9,661,768 B2
(45) Date of Patent: May 23, 2017

(54) INTERCHANGEABLE ELECTRICALLY POWERED MODULES AND RECEPTACLE THEREFOR

(71) Applicant: John S. Haw, Aliso Viejo, CA (US)

(72) Inventor: John S. Haw, Aliso Viejo, CA (US)

(*) Notice: Subject to any disclaimer, the term of this patent is extended or adjusted under 35 U.S.C. 154(b) by 0 days.

(21) Appl. No.: 14/967,063

(22) Filed: Dec. 11, 2015

(65) Prior Publication Data

US 2016/0285220 A1  Sep. 29, 2016

Related U.S. Application Data

(60) Provisional application No. 62/091,368, filed on Dec. 12, 2014.

(51) Int. Cl.
| | |
|---|---|
| H05K 5/02 | (2006.01) |
| H01R 13/514 | (2006.01) |
| H01R 24/78 | (2011.01) |
| H02G 3/16 | (2006.01) |
| H01R 24/52 | (2011.01) |
| H01R 13/629 | (2006.01) |
| H02G 3/08 | (2006.01) |
| H05K 5/00 | (2006.01) |
| H01R 25/00 | (2006.01) |
| B60R 16/023 | (2006.01) |
| H01R 13/639 | (2006.01) |
| H02G 3/12 | (2006.01) |

(52) U.S. Cl.
CPC ......... *H05K 5/0208* (2013.01); *H01R 13/514* (2013.01); *H01R 24/78* (2013.01); *H02G 3/16* (2013.01); *B60R 16/0239* (2013.01); *H01R 13/6295* (2013.01); *H01R 13/6395* (2013.01); *H01R 24/525* (2013.01); *H01R 25/006* (2013.01); *H02G 3/08* (2013.01); *H02G 3/121* (2013.01); *H05K 5/00* (2013.01)

(58) Field of Classification Search
CPC .............. H01R 13/6295; H01R 24/525; H01R 13/6395; H01R 24/78; H01R 25/006; H02G 3/08; H05K 5/00; B60R 16/0239
USPC ................................... 439/535, 373; 174/50
See application file for complete search history.

(56) References Cited

U.S. PATENT DOCUMENTS

| | | | | |
|---|---|---|---|---|
| 5,599,190 A | * | 2/1997 | Willette ............... | H01R 13/518 439/43 |
| 8,882,536 B2 | * | 11/2014 | Utz .................... | H01R 23/6866 439/535 |

(Continued)

*Primary Examiner* — Abdullah Riyami
*Assistant Examiner* — Justin Kratt
(74) *Attorney, Agent, or Firm* — Roy A. Ekstrand

(57) ABSTRACT

A plurality of interchangeable, electrically powered, modules and receptacles for use therewith are provided. The interchangeable electrically powered modules are configured and capable of providing a variety of electrical and electronic devices. Each receptacle is configured to be secured to and supported by an otherwise conventional electric back box. The receptacles preferably utilize a bayonet mount receptacle which is standardized for the entire system and which accommodates each and every module in a twist-lock mounting system. Each module includes a cooperating bayonet mount attachment for use with the receptacle bayonet mounts. The use of a bayonet mount attachment for the modules to the receptacle provides a standardized power coupling for the module devices which may be connected by a simple insert and partial turn locking action.

12 Claims, 17 Drawing Sheets

(56) References Cited

U.S. PATENT DOCUMENTS

2012/0184132 A1* 7/2012 Katou .................... H01R 13/64
439/535
2013/0267116 A1* 10/2013 Tin ........................... H02J 1/00
439/535

* cited by examiner

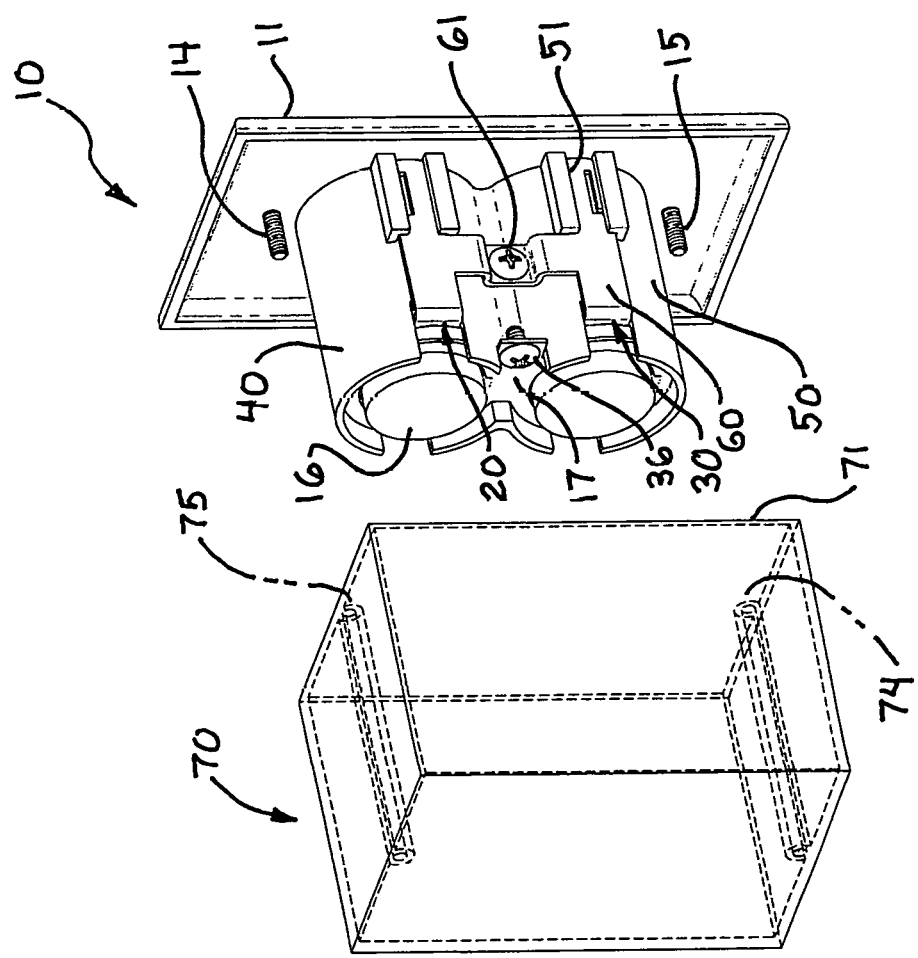

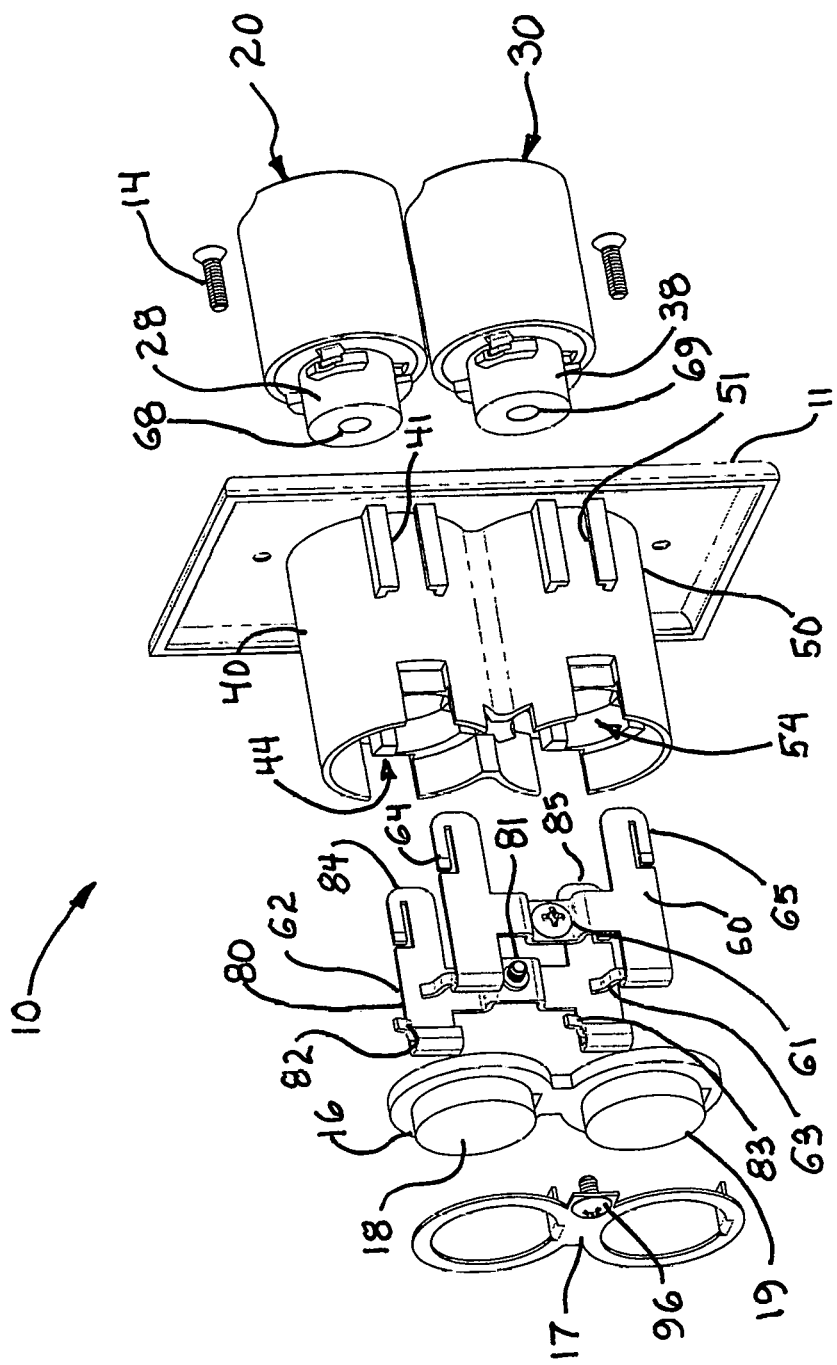

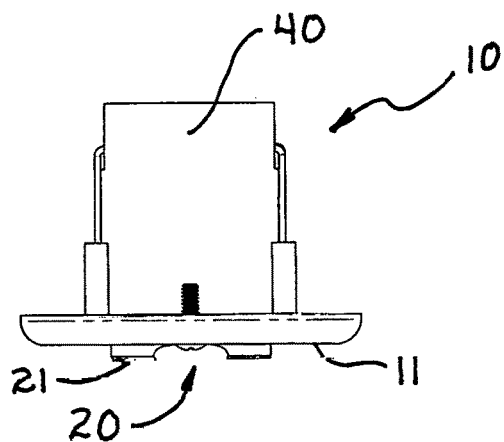
Fig 6
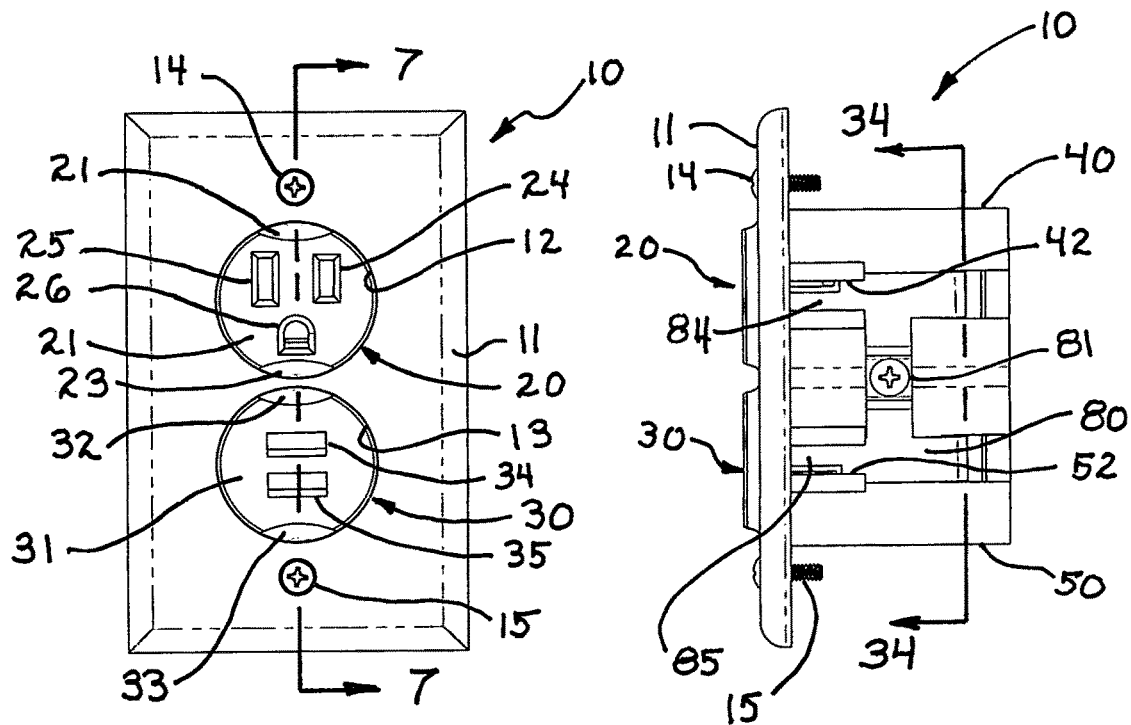
Fig 4
Fig 5

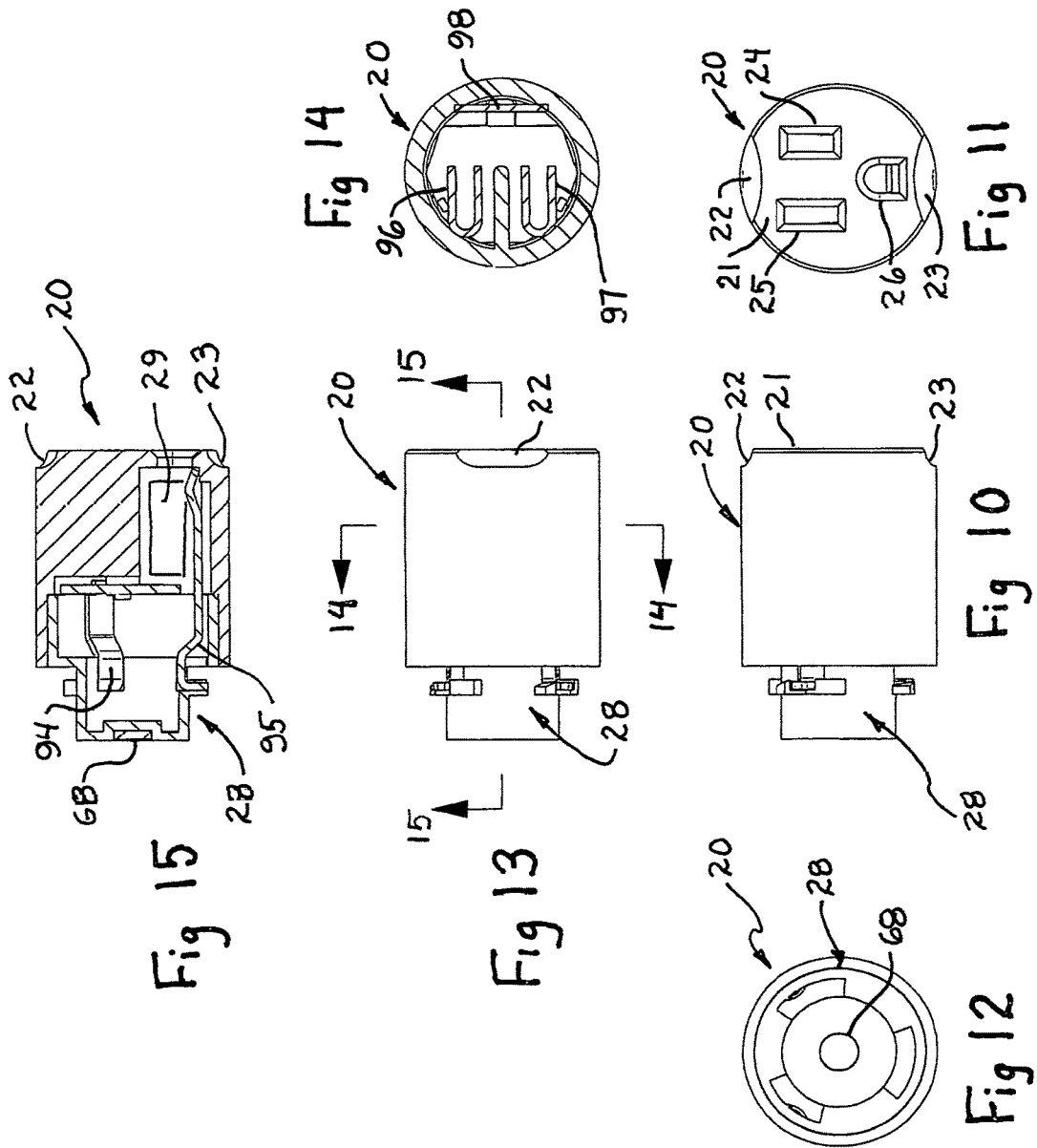

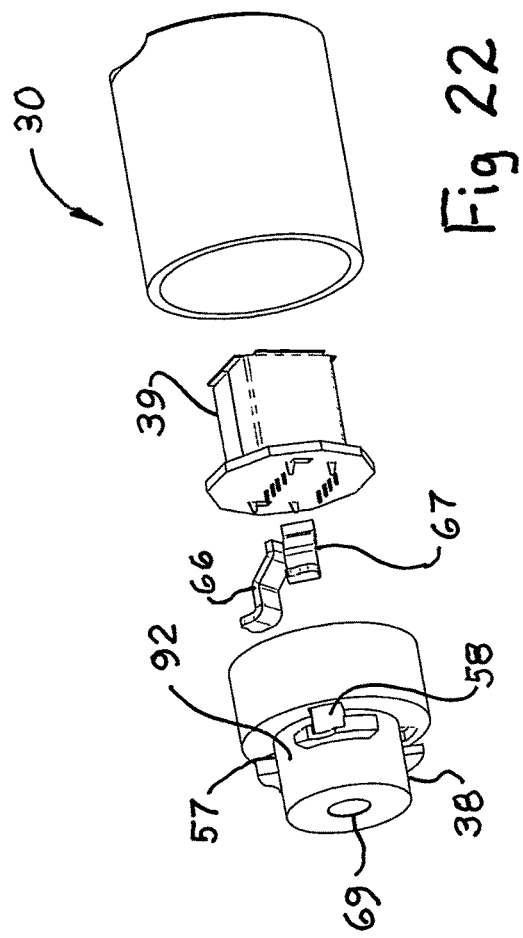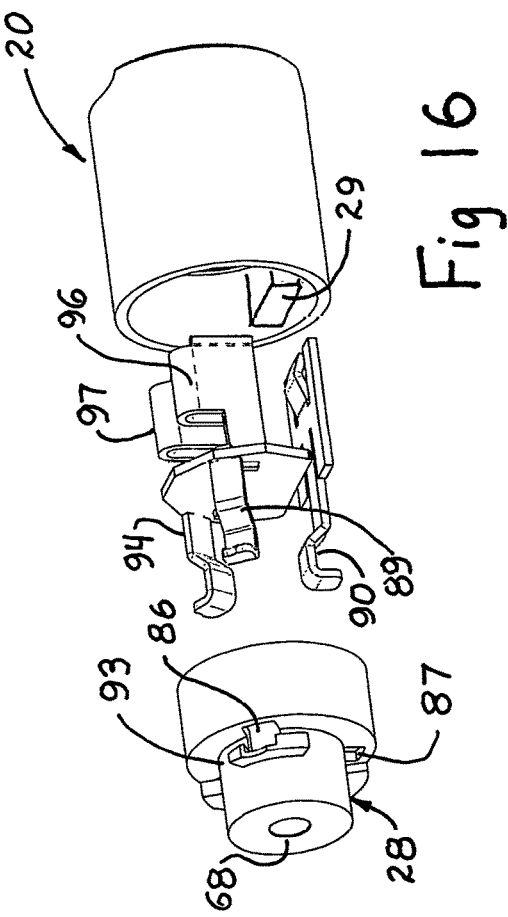

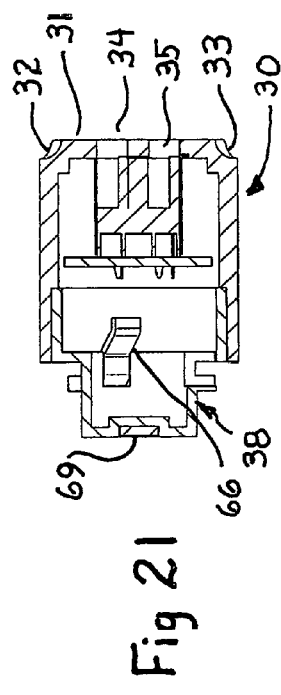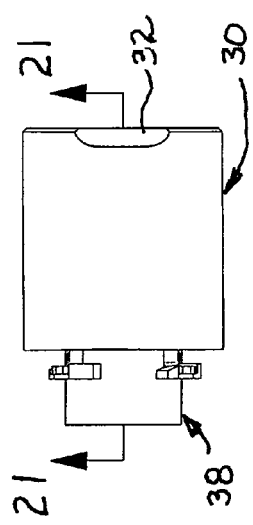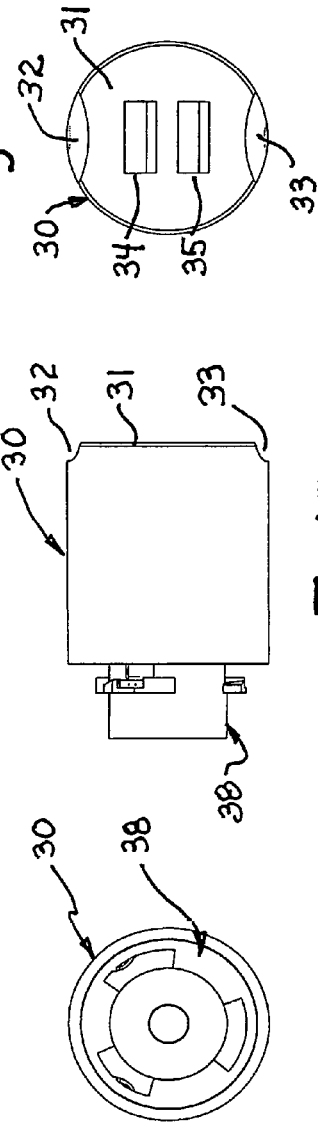

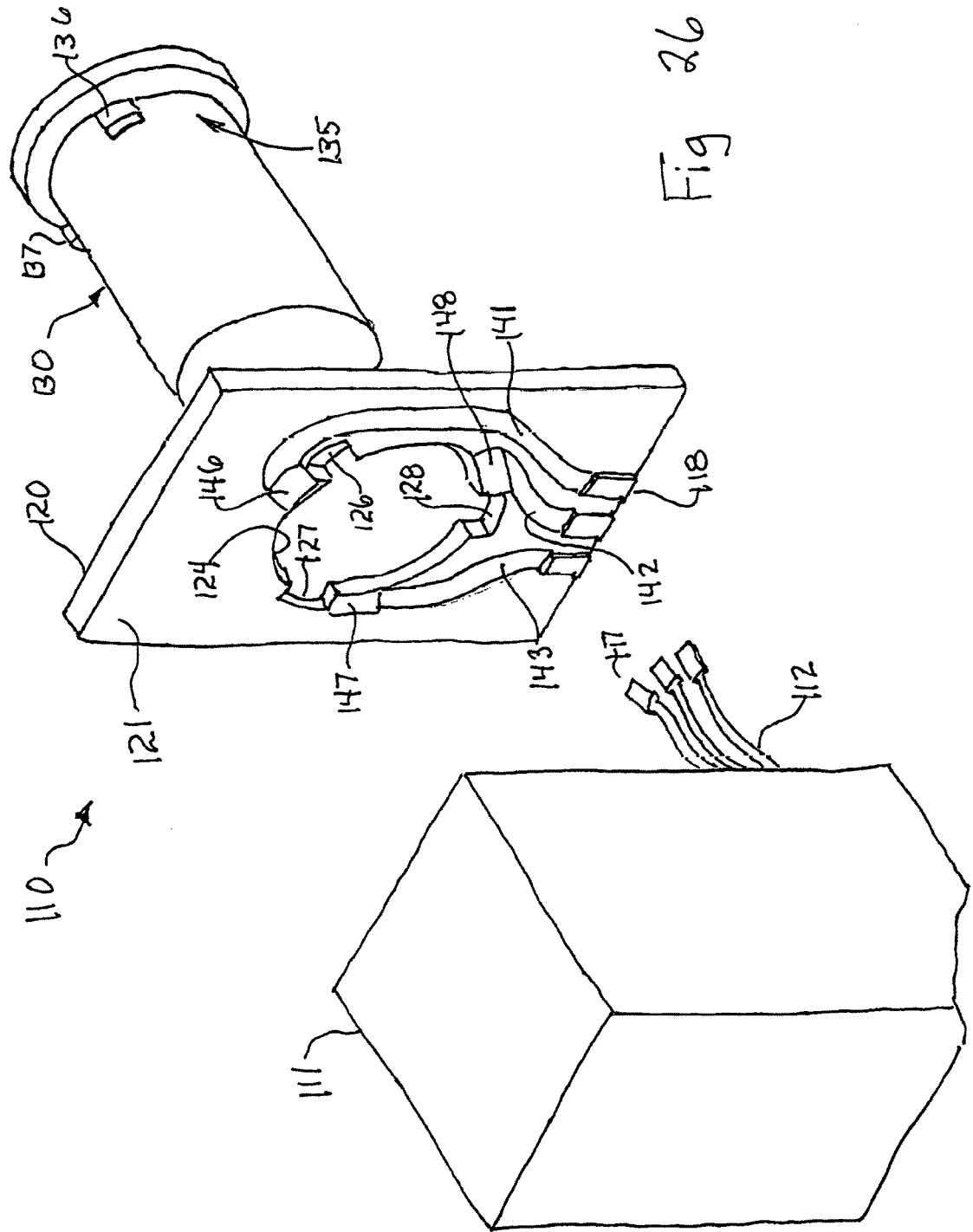

INTERCHANGEABLE ELECTRICALLY POWERED MODULES AND RECEPTACLE THEREFOR

CROSS-REFERENCE TO RELATED APPLICATION

This application claims the benefit of and priority under 35 U.S.C. 119(e) of U.S. Provisional Patent Application No. 62/091,368, entitled INTERCHANGEABLE ELECTRICALLY POWERED MODULES AND RECEPTACLES THEREFOR, filed Dec. 12, 2014 in the name of John S. Haw, the disclosure of which is incorporated herein by reference.

FIELD OF THE INVENTION

This invention relates generally to electrically powered apparatus and particularly to electrically powered apparatus which utilize devices housed within interchangeable modular apparatus together with cooperating electrically powered receptacles.

BACKGROUND OF THE INVENTION

In a typical electrically powered receptacle of the type commonly used in both residential and commercial facilities, a protective metal or plastic box is supported within a wall opening and defines an outwardly oriented open face. A plurality of power coupling wires are threaded to the interior of the protective metal box. A receptacle configured to be received within and supported by the protective box supports one or more receptacles which are electrically connected to the power carrying wires within the box. A protective cover plate is mounted upon the exterior open face of the protective box and extends about the periphery of the wall opening receiving the protective box. In most instances, the protective cover defines appropriately sized and arranged apertures which allow access to the plug receptacles.

In typical use, a number of differently configured appliances, tools, lights and other electrically powered apparatus are plugged into a plug receptacle to tap electrical power for operation of the apparatus. Many devices such as electronic equipment, computers and other electronic devices operate at lower voltages and current than the conventional available electric power. Accordingly, such devices require an adapter and power converter which, in essence, plugs into the available electric power within the receptacle and converts the higher voltage electric power to a lower voltage and current typical of the operative supply voltages and currents for electronic and computer devices.

While the presently used power converters and adapters employed for operating computers and other electronic equipment utilizing conventional powered receptacles has to some extent enjoyed commercial success and extended use, the use of such adapters often proves to be impractical, costly, cumbersome and in some instances unsafe. Many computer and electronic apparatus operate utilizing internal battery power supplies which must be recharged utilizing adapters and the like. All of this leads to a substantial clutter and inefficiency as multiple adapters and power converters are utilized in a typical home, office or commercial establishment.

As a result of the ever expanding use of computer and other electronic apparatus within the typical home, office and commercial establishment, a long-felt and unresolved need arises for systems more appropriately adapted to the use of power devices. There remains a more extended use for systems which accommodates such devices and which avoid the need for individual adapters and power converters while efficiently and effectively providing convenient electrical power for such apparatus.

There remains a further need for apparatus that increases the flexibility and effective use of the wall outlets within an electric power system by introducing the capability of multiple use modules that connect an otherwise conventional electric power box to a plurality of functional units having electric power and digital and electronic communication capability along with a variety of system functionality.

SUMMARY OF THE INVENTION

Accordingly, it is a general object of the present invention to provide an improved system for utilizing electrical power access in accommodating and powering computer and other electronic devices. It is a more particular object of the present invention to provide an improved system for accommodating and powering computer and electronic devices which provides a plurality of interchangeable modularized and electrically powered receptacles for use in providing electrical power to such devices.

The present invention provides a plurality of interchangeable, electrically powered, modules and receptacles for use therewith. The interchangeable electrically powered modules are configured and capable of providing a variety of electrical and electronic devices. Each receptacle is configured to be secured to and supported by an otherwise conventional electric back box. The receptacles preferably utilize a bayonet mount receptacle which is standardized for the entire system and which accommodates each and every module in a twist-lock mounting system. Each module includes a cooperating bayonet mount attachment for use with the receptacle bayonet mounts. The use of a bayonet mount attachment for the modules to the receptacle provides a standardized power and data coupling for the module devices which is connected by a simple insert and partial turn locking action. Conductive pads on the interior surface of the receptacle adjacent the bayonet mount receptacle slots, engage the cooperating bayonet mount tabs of the modules to provide connection for electric power and data transmission. The receptacle may provide a single device receiving receptacle or alternatively, provide accommodation for a pair of receptacles or by further alternate configuration, a quartet of modules.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

FIG. 2 sets forth a rear perspective view of the interchangeable electrically powered plug-in modules and receptacle therefor shown in FIG. 1 assembled to a conventional electric utility box;

FIG. 3 sets forth a rear perspective assembly view of the interchangeable electrically powered plug-in modules and receptacle therefor shown in FIG. 1;

FIG. 4 sets forth a front view of a receptacle supporting a pair of interchangeable electrically powered plug-in modules;

FIG. 5 sets forth a right side view of the receptacle and interchangeable electrically powered plug-in modules shown in FIG. 4;

FIG. 6 sets forth a top view of the receptacle and interchangeable electrically powered plug-in modules shown in FIGS. 1 through 5;

FIG. 10 sets forth a side elevation view of a typical plug-in module;

FIG. 11 sets forth a front view of the plug-in module shown in FIG. 10;

FIG. 12 sets forth a rear view of the plug-in module shown in FIG. 10;

FIG. 13 sets forth a top view of the module shown in FIG. 10;

FIG. 14 sets forth a section view of the module shown in FIG. 13 taken along section lines 14-14 therein;

FIG. 15 sets forth a section view of the module shown in FIG. 13 taken along section lines 15-15 therein;

FIG. 16 sets forth a perspective assembly view of the module shown in FIGS. 10 through 15;

FIG. 17 sets forth a side elevation view of a plug-in module constructed to receive USB plug-ins;

FIG. 18 sets forth a front view of the module shown in FIG. 17;

FIG. 19 sets forth a rear view of the module shown in FIG. 17;

FIG. 20 sets forth a top view of the module shown in FIG. 17;

FIG. 21 sets forth a section view of the module shown in FIG. 20 taken along section lines 21-21 therein;

FIG. 22 sets forth a perspective assembly view of the plug-in module shown in FIGS. 17 through 21;

FIG. 26 sets forth an alternative perspective assembly view of the interchangeable electrically powered module and receptacle therefor set forth in FIGS. 23 through 25;

DESCRIPTION OF THE PREFERRED EMBODIMENTS

By way of overview, the present invention provides a receptacle mounting plate supported by an otherwise conventional wall mounted electric back box which mounting plate supports a single receptacle, a pair of receptacles or a quartet of receptacles. Each receptacle being standardized in shape and configuration and each being capable of receiving any one of a plurality of interchangeable operative modules. The invention further includes a plurality of interchangeable electrically powered modules capable of providing a variety of functional operations and each supporting a standardized coupling structure for cooperatively engaging with any of the sockets within the modular device receptacle. In the preferred fabrication of the present invention, the sockets and the engaging mounting structure of the modules provide an otherwise conventional and twist bayonet mount structure. As a result, each module may be operatively plugged into and engage any of the available sockets within any available receptacle and receive operative electrical power and transmit data therefrom. Because the modules and cooperating receptacles are able to provide engagement and disengagement of a module without the need to interrupt the power to the receptacles, the modules are "hot-swapping" in operation. This provides substantial advantage as modules are moved to and from receptacles as desired.

Figure 1:
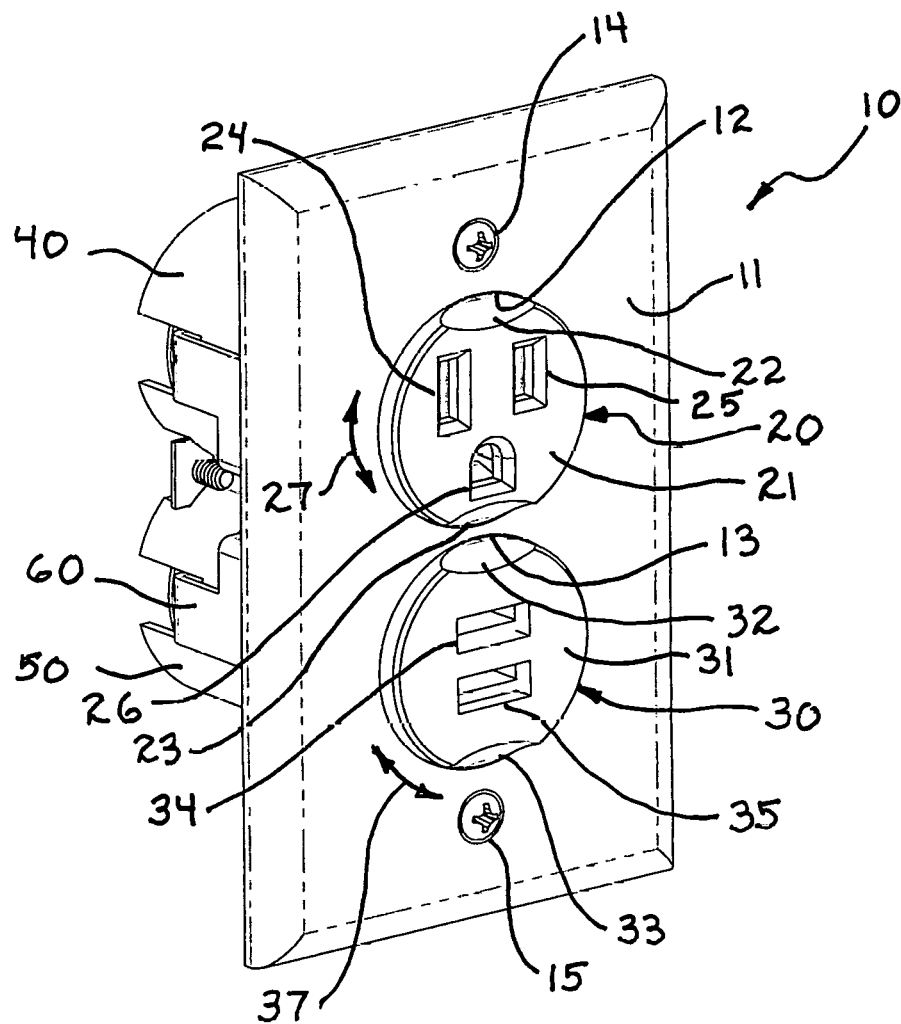
FIG. 1 sets forth a front perspective view of a receptacle supporting a pair of interchangeable electrically powered plug-in modules.

FIG. 1 sets forth a perspective view of a module receptacle constructed in accordance with the present invention and generally referenced by numeral 10. Module receptacle 10 is shown supporting a pair of plug-in modules 20 and 30. In accordance with the present invention, module receptacle 10 includes a generally planar front plate 11 defining a pair of module receiving apertures 12 and 13. Module receptacle 10 further includes a module housing 40 extending rearwardly from the back surface of front plate 11 and further includes a module housing 50 also extending rearwardly from the back surface of front plate 11. As is better seen in FIGS. 2 and 3, module housing 40 and module housing 50 are substantially cylindrical and are aligned with apertures 12 and 13 respectively (seen in FIG. 1). As is also better seen in FIG. 3, modules 20 and 30 are generally cylindrical and sized to be inserted into module housings 40 and 50. In accordance with an important aspect of the present invention, a plurality of different electronic and digital functional modules may be interchangeably inserted into module receptacle 10. In the example shown in FIG. 1, module 20 defines a front face 21 which in turn defines a pair of grip surfaces 22 and 23. Front face 21 further defines a plurality of plug apertures 24, 25 and 26 which are configured to receive a standard three prong plug of the type normally used to plug electrical appliances, or the like, into a conventional wall outlet in order to receive operative electrical power. Similarly, module 30 includes a front face 31 defining a pair of grip surfaces 32 and 33. Front face 31 of module 30 further defines a pair of plug apertures 34 and 35 which are configured to receive conventional plugs of the type used for standard USB connection.

Module receptacle 10 further supports a pair of terminal connectors 60 and 80 (connector 80 better seen in FIG. 3) which, as is described below, are operative to communicate electric power to the plug-in modules within modular housings 40 and 50. Suffice it to note here that terminal connectors 60 and 80 function to facilitate electric power input from the household electrical wiring system by using conventional wired connections to each of terminal connectors 60 and 80. Modules 20 and 30, shown in FIGS. 2 and 3, are installed within module housings 40 and 50 respectively by inserting the modules through apertures 12 and 13 and rotating the modules in the manner indicated by arrows 27 and 37. This rotation operates to engage and disengage the bayonet type attachments described below. Suffice it to note here that these bayonet attachments secure the plug-in modules within module housing 10 and engage electrical connection to the modules.

FIG. 2 sets forth a rear perspective view of module receptacle 10 supporting plug-in modules 20 and 30. Also shown in FIG. 2 is a conventional electric wiring box 70 of the type typically used in household and commercial establishment electric power systems. In the anticipated application of the present invention plug-in interchangeable electrically powered modules, electric box 70 is recessed within a wall surface and supported such that open face 71 and tabs 73 and 74 are exposed through an aperture in the wall surface. In accordance with the typical utilization of the present invention interchangeable electrically powered plug-in modules and receptacle therefor, receptacle 10 is inserted into electric box 70 and is secured to tabs 73 and 74 using threaded fasteners 14 and 15. In this manner, receptacle 10 is entirely supported and enclosed by electric box 70. Thereafter, and in accordance with the descriptions set forth below, once module receptacle 10 has been secured within electric box 70, different plug-in modules may be inserted into module receptacle 10 by simply removing either or both of modules 20 or 30 and plugging in different modules.

Module receptacle 10 also includes elongated slots 41 and 51 formed on the side portions of module housings 40 and 50. As is better seen in FIG. 5, it will also be noted that module housings 40 and 50 also support elongated slots 42 and 52 respectively on the opposite sides of module housings 40 and 50. With simultaneous reference to FIGS. 2 and 5, elongated slots 41, 42, 51 and 52 are operative in combination with support tabs 64 and 65 of terminal connector 60 and support tabs 84 and 85 of terminal connector 80 to secure terminal connectors 60 and 80 to module housings 40 and 50.

FIG. 3 sets forth a rear perspective assembly w view of module receptacle 10 and plug in modules 20 and 30, As is set forth above, module receptacle 10 includes a module housings 40 and 50 extending rearwardly from the back surface of front plate 11. Module housing 40 supports slot 41 while module housing 50 supports slot 51. As is better seen in FIG. 5, module housings 40 and 50 also support slots 42 and 52 respectively. Module housing 40 includes a bayonet receptacle (attachment receptacle) 44 which cooperates with bayonet cap 28 of plug-in module 20 to provide mechanical attachment of and electrical power coupling to plug-in module 20. Similarly, module housing 50 includes a bayonet receptacle (attachment receptacle) 54 which cooperates with bayonet cap 38 of plug-in module 30 to provide mechanical attachment of and electrical power coupling to plug-in module 30. A terminal connector 60 is formed of an electrically conductive; metal and includes a wire connection 61 and support tabs 64 and 65. Terminal connector 60 further includes connection tabs 62 and 63. Terminal connector 60 is secured to module housings 40 and 50 by the insertion of support tabs 64 and 65 into slots 41 and 51 respectively in the assembly shown in FIG. 2. Similarly, a terminal connector 80 is formed an electrically conductive metal and includes a wire connection 81 and support tabs 84 and 85. Terminal connector 80 further includes connection tabs 82 and 83. Terminal connector 80 is d to module housings 40 and 50 by the insertion of support tabs 84 and 85 into slots 42 and 52 respectively in the assembly shown in FIG. 5. A cap unit 16 includes a pair of cap segments 18 and 19 which are sized to cover bayonet caps 28 and 38 of plug-in modules 20 and 30 when the plug-in modules are inserted into module housings 40 and 50. Cap unit 16 is joined to the module housings 40 and 50 to provide closure of module housings 40 and 50 and prevent unit ended contact with housing conductors when a module has been removed from module receptacle 10. A retainer 17 is formed in a general "figure eight" shape and is received upon cap unit 16 and is secured in place by tabs 46 and 47 inserted through slots formed in cap unit 16. Retainer 17 is formed of a conductive metal and provides ground connections for modules 20 and 30. Retainer 17 includes a threaded fastener 36 which is used to secure a ground wire (not shown) within electric box 70 (seen in FIG. 2).

In operation, module receptacle 10 is assembled by initially assembling terminal connectors 60 and 80 to module housings 40 and 50 using support tabs 64 and 65 together with support tabs 84 and 85 inserted into slots 41 and 51, and 52 and 53 respectively. Thereafter, cap unit 16 and retainer 17 are assembled to the ends of module housings 40 and 50. Once module receptacle 10 is assembled, electrical wiring of power wires (not show) to connections 61 and 81 may be performed and module receptacle 10 may be inserted into an electric box, such as box 70 shown in FIG. 2 and secured therein by fasteners 14 and 15. Selected plug-in modules, such as plug-in modules 20 and 30 may be installed within, or removed from, module receptacle 10 as desired.

FIG. 4 sets forth a front view of module receptacle 10. Module receptacle 10 is shown supporting a pair of plug-in modules 20 and 30. As described above, module receptacle 10 includes a generally planar front plate 11 defining a pair of module receiving apertures 12 and 13. In accordance with an important aspect of the present invention, a plurality of different electronic and digital functional modules may be interchangeably inserted into module receptacle 10. In the example shown in FIG. 4, module 20 defines a front face 21 which in turn defines a pair of grip surfaces 22 and 23. Front face 21 further defines a plurality of plug apertures 24, 25 and 26 which are configured to receive a standard three prong plug of the type normally used to plug electrical appliances, or the like, into a conventional wall outlet in order to receive operative electrical power. Similarly, module 30 includes a front face 31 defining a pair of grip surfaces 32 and 33. Front face 31 of module 30 further defines a pair of plug apertures 34 and 35 which are configured to receive plugs of the type used for USB connection.

FIG. 5 sets forth a right side view of the receptacle and interchangeable electrically powered plug-in modules shown in FIG. 4. As is described above, module receptacle 10 includes a front plate 11 supporting a pair of rearwardly extending module housings 40 and 50. Module housings 40 and 50 include slots 42 and 52. A terminal connector 80 includes support tabs 84 and 85 which are received within slots 42 and 52 to secure terminal connector 80.

FIG. 6 sets forth a top view of the receptacle and interchangeable electrically powered plug-in modules shown in FIG. 4. As is described above, module receptacle 10 includes a front plate 11 supporting a rearwardly extending module housing 40. Module receptacle 10 also supports a plug-in module 20 having a front face 21.

Figure 7:
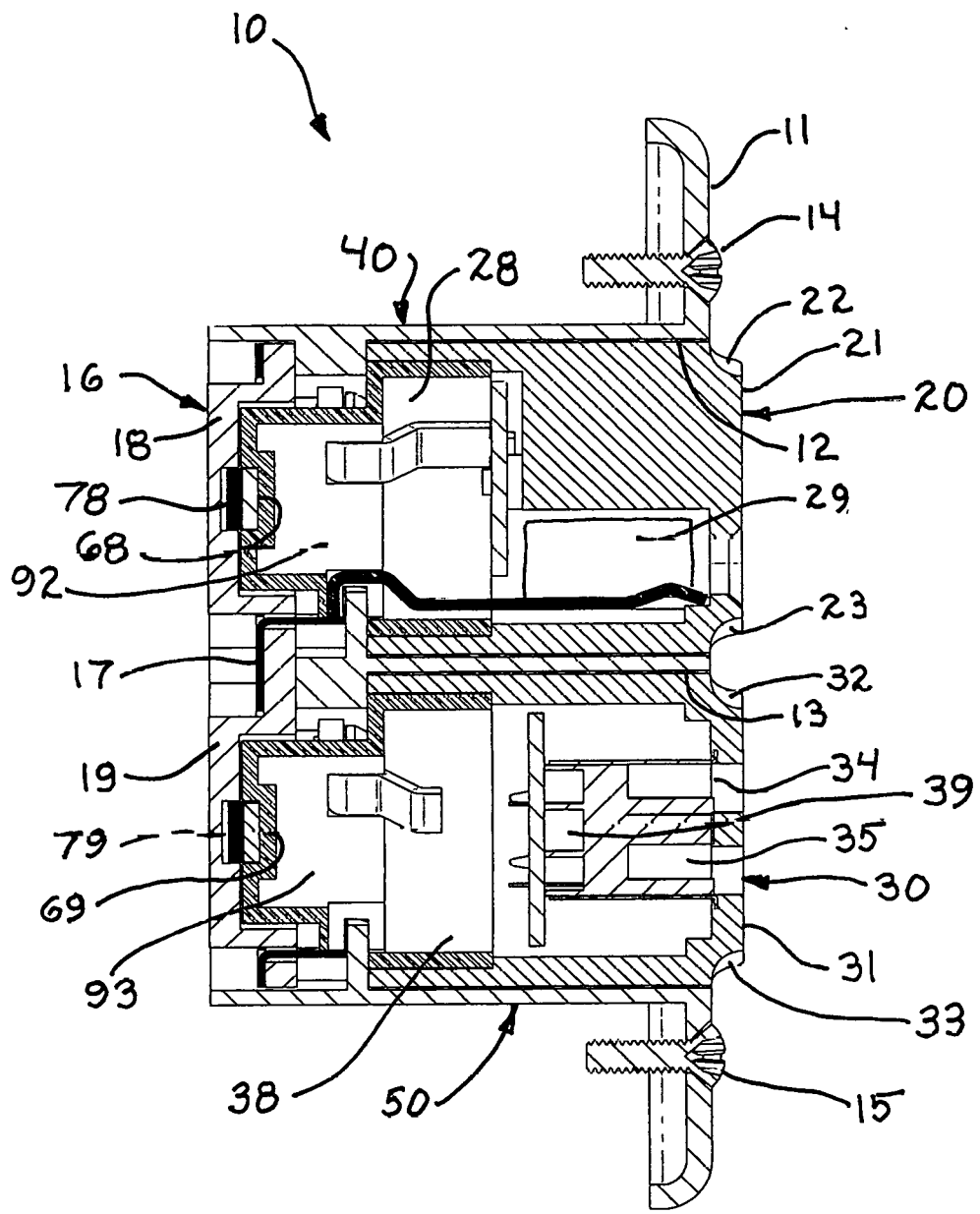
FIG. 7 sets forth a section view of the interchangeable electrically powered plug-in modules and receptacle therefor shown in FIG. 4 taken along section lines 7-7 therein.

FIG. 7 sets forth a section view of the interchangeable electrically powered plug-in modules and receptacle therefor shown in FIG. 4 taken along section lines 7-7 therein. A pair of plug-in modules 20 and 30 are also shown in FIG. 7. It will be recalled that the present invention further includes a plurality of interchangeable electrically powered modules each capable of providing one, or more, of a variety of functional operations and each supporting a standardized coupling structure for cooperatively engaging with any of the sockets within the module receptacle 10. In the preferred fabrication of the present invention, the sockets and the engaging mounting structures of the modules provide an otherwise conventional and twist operated bayonet mount structure. As a result, each module may be operatively plugged into and engage any of the available sockets within any available module receptacle, such as module receptacle 10, and receive operative electrical power and transmit data therefrom. It will also be recalled that the modules and cooperating receptacles are able to provide engagement and disengagement of a module without the need of interrupting the power to the receptacles. This provides substantial advantage as modules are moved to and from receptacles as desired.

Continuing in FIG. 7 and as is described above, module receptacle 10 includes a generally planar front plate 11 defining apertures 12 and 13. A pair of threaded fasteners 14 and 15 are supported by front plate 11. Module receptacle 10 further includes a pair of generally cylindrical module housings 40 and 50 extending rearwardly from back surface 91. Module housing 40 defines a module-receiving cavity 43. Similarly, module housing 50 defines a module-receiving cavity 53. Module-receiving cavities 43 and 53 are aligned with, and extend from apertures 12 and 13 respectively. Module housing 40 further includes a conventional bayonet receptacle 44 at the end of module-receiving cavity 43. Similarly, module housing 50 further includes a conventional bayonet receptacle 54 at the end of module-receiving cavity 53. Cap unit 16, best seen in FIG. 3, includes a pair of cap segments 18 and 19 which are fused to module housings 40 and 50 and which cover and electrically insulate bayonet receptacles 44 and 54. Retainer 17, also better seen in FIG. 3, is fitted upon cap segments 17 and 18 and provides electrical ground connections. Bayonet receptacles 44 and 54 each define a plurality of slots, such as slots 45 and 55 which receive tabs 82 and 83 of terminal connector 80 (seen in FIG. 3).

Continuing in FIG. 7, plug-in modules 20 and 30 are received within module-receiving cavities 43 and 53 (seen in FIG. 9) of module receptacle 10. Plug-in module 20 includes a front face 21 having grips 22 and 23 formed therein. As is better seen in FIG. 1, front face 21 further defines a plurality of plug apertures 24, 25 and 26 which receive conventional plug prongs for electrical connection. Plug-in module 20 includes a bayonet cap 28 which completes plug-in module 20 and includes a bayonet mount 92 (better seen in FIG. 22). Bayonet mount 92 is of conventional fabrication and will be understood to cooperatively engage bayonet receptacle 44 to mechanically support plug-in module 20 and make required electrical connections to plug-in module 20. Plug-in module 20 also includes a functional circuit 29 which performs module functions such as electronic communications, or the like. Similarly, plug-in module 30 includes a front face 31 having grips 32 and 33 formed therein. As is better seen in FIG. 1, front face 31 further defines a pair of USB plug apertures 34 and 35 which receive conventional USB type connection plugs for power transmission and data communication. Plug-in module 30 includes a bayonet cap 38 which completes plug-in module 30 and includes a bayonet mount 93 (better seen in FIG. 22). Bayonet mount 93 is of conventional fabrication and will be understood to cooperatively engage bayonet receptacle 54 to mechanically support plug-in module 30 and make required electrical connections to plug-in module 30. Plug-in module 30 also includes a functional circuit 39 which performs module functions such as data communications, or the like.

In accordance with an important feature of the present invention, cap segments 18 and 19 of cap unit 16 each support a permanent magnet 78 and 79. Correspondingly, bayonet caps 28 and 38 of plug-in modules 20 and 30 respectively support permanent magnets 68 and 78 respectively. As each plug-in module is inserted into a module housing, the magnet supported by the cap segment and the magnet supported by the plug-in module bayonet cap are brought into close proximity. Because the magnets are oriented to bring like magnetic poles together, a repulsive magnetic force is created that urges the plug-in module outwardly from the module receptacle. As a result, once the module is rotated to release its bayonet connection, the magnets push the plug-in module outwardly a short distance which in turn aids plug-in module withdrawal.

Figure 34:
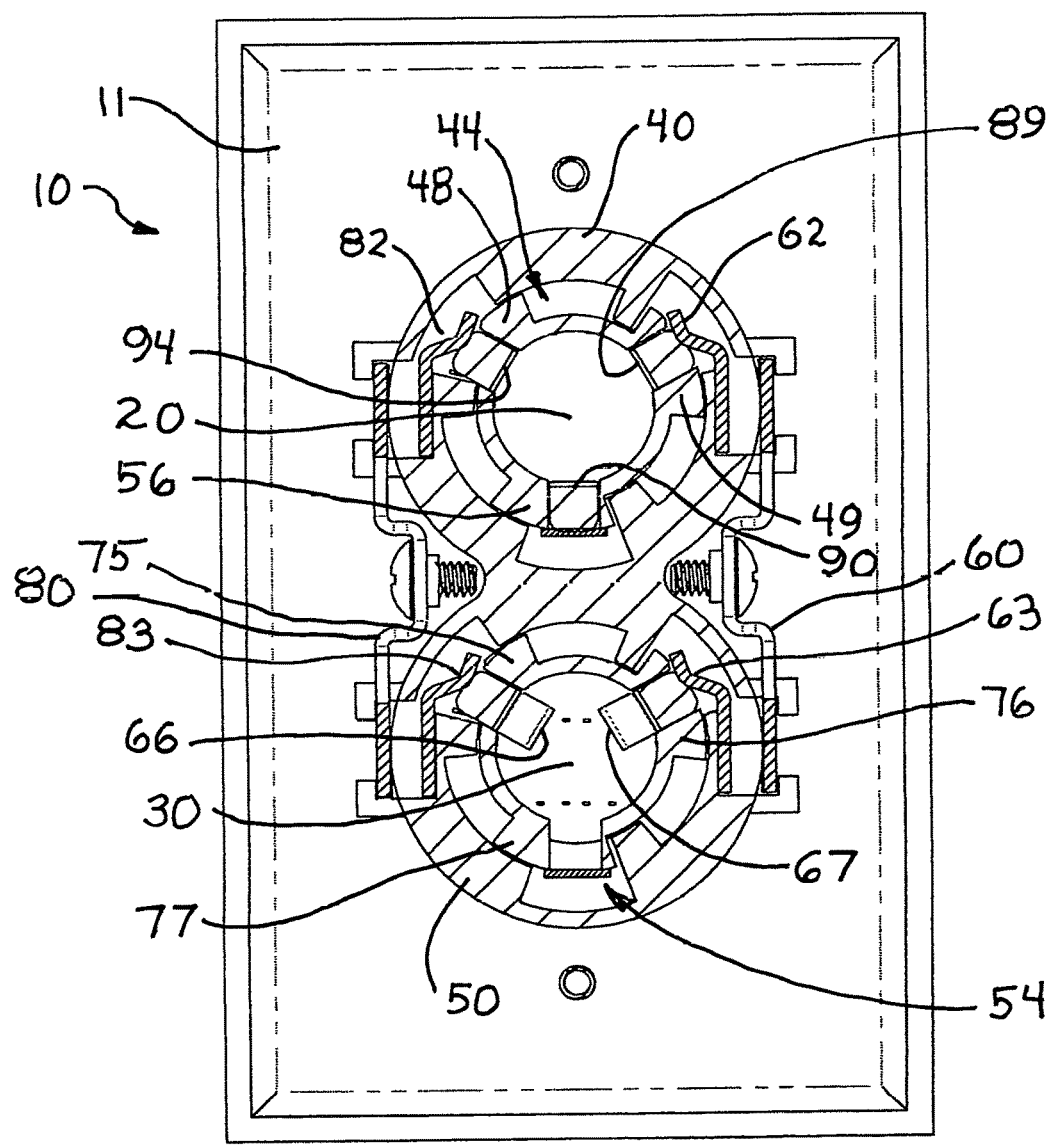
FIG. 34 sets forth a section view of the interchangeable electrically powered plug-in modules and receptacle therefor shown in FIG. 5 taken along section lines 34-34 therein.

With temporary reference to FIG. 34 below, a cooperating feature of the present invention use of a bayonet type attachment for the plug-in modules may be discussed at this point. FIG. 34 sets forth a section view of module receptacle 10 taken along section line 34-34 in FIG. 5. Module receptacle 10 is shown supporting plug-in modules 20 and 30 inserted and secured within module housings 40 and 50 respectfully. Module receptacle 10 includes module housing 40 which defines a bayonet receptacle 44 and a module housing 50 which defines a bayonet receptacle 54. Terminal connector 60 is supported against one side of module housings 40 and 50 and includes a tab 62 extending into bayonet receptacle 44 and a tab 63 extending into bayonet receptacle 54. Similarly, terminal connector 80 is supported against the opposite side of module housings 40 and 50 and includes a tab 82 extending into bayonet receptacle 44 and a tab 83 extending into bayonet receptacle 54. Module 20, shown inserted into module housing 40, includes a plurality of radially extending bayonet tabs 48, 49 and 56 which engage bayonet receptacle 44. Plug-in module 20 also includes connectors 94, 89 and 90 which are supported upon bayonet tabs 48, 49 and 56 respectively. Tabs 62 and 82 contact connectors 89 and 94 to provide electric power. In addition, bayonet tabs 48 and 49 and connectors 94 and 89 define shallow detent recesses which receive the convexly curved portions of tabs 82 and 62 to provide a spring detent of the bayonet attachment between module 20 and bayonet receptacle 44.

In a similar manner and with continued reference to FIG. 34, module 30, shown inserted into module housing 50, includes a plurality of radially extending bayonet tabs 75, 76 and 77 which engage bayonet receptacle 54. Plug-in module 30 also includes connectors 66 and 67 which are supported upon bayonet tabs 75 and 76 respectively. Tabs 75 and 76 contact connectors 66 and 67 to provide electric power. In addition, bayonet tabs 75 and 76 and connectors 66 and 67 define shallow detent recesses which receive the convexly curved portions of tabs 83 and 63 to provide a spring detent of the bayonet attachment between module 30 and bayonet receptacle 54. The detent positioning of modules 20 and 30 thus provided maintains the fully seated rotational positions of the modules within the module receptacles.

Figure 8:
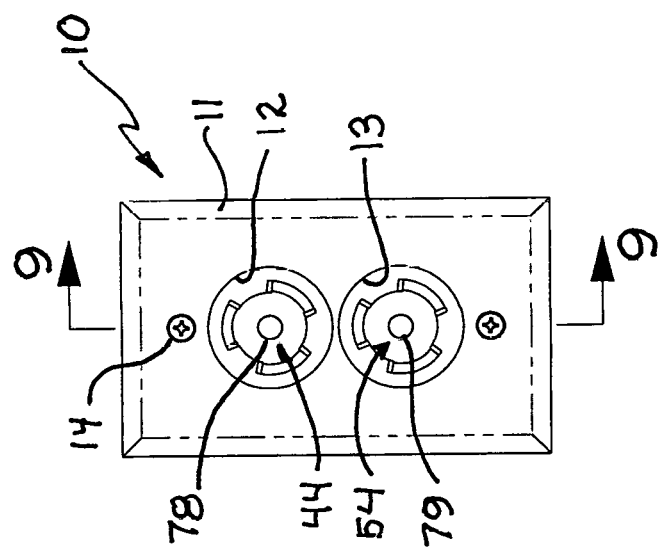
FIG. 8 sets forth a front view of the receptacle for receiving interchangeable electrically powered plug-in modules having the plug-in modules removed therefrom.

FIG. 8 sets forth a front view of module receptacle 10. As described above, module receptacle 10 includes a generally planar front plate 11 defining a pair of module receiving apertures 12 and 13. Module receptacle 10 also includes a pair of bayonet receptacles 44 and 54. Fasteners 14 and 15 are used to secure module receptacle within electric box 70.

In accordance with an important aspect of the present invention, a plurality of different electronic and digital functional modules may be interchangeably inserted into module receptacle 10. In the examples shown and described above, module 20 which defines a pair of grip surfaces 22 and 23 provides a plurality of plug apertures 24, 25 and 26 configured to receive a standard three prong plug. Module 30, also shown above, includes a front face 31 defining a pair of grip surfaces 32 and 33 and a pair of plug apertures 34 and 35 which are configured to receive conventional plugs of the type used for standard USB connection. Modules 20 and 30 are merely illustrative of the variety of modules that may be used. Accordingly, it will be apparent to those skilled in the art that other types of interchangeable plug-in modules may be inserted into module receptacle 10 without departing from the spirit and scope of the present invention.

Figure 9:
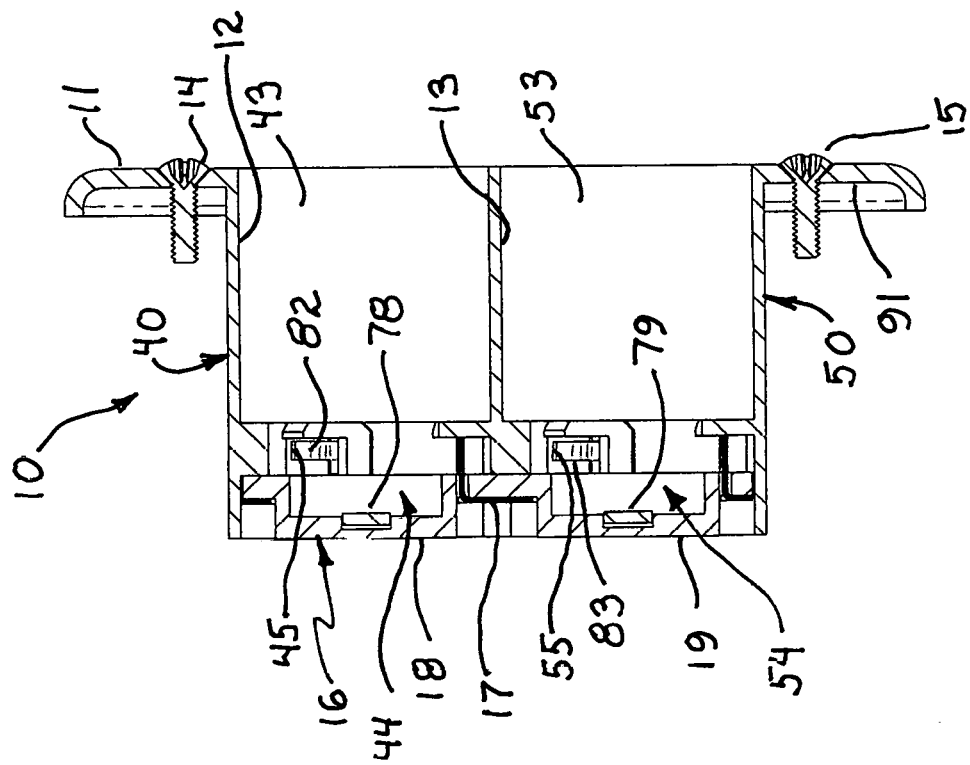
FIG. 9 sets forth section view of the receptacle shown in FIG. 8 taken along section lines 9-9 therein.

FIG. 9 sets forth a section view of module receptacle 10 having plug-in modules 20 and 30 removed. In accordance with an important aspect of the present invention, module receptacle 10 is electrically connected to and installed within wall box 70 (seen in FIG. 2). Once module receptacle 10 is thus installed, any selected plug-in module may be inserted and secured using a twist lock.

Continuing in FIG. 9 and as is previously described above, module receptacle 10 includes a generally planar front plate 11 defining apertures 12 and 13. A pair of threaded fasteners 14 and 15 are supported by front plate 11. Module receptacle 10 further includes a pair of generally cylindrical module housings 40 and 50 extending rearwardly from back surface 91, module housing 40 defines a module-receiving cavity 43. Similarly, module housing 50 defines a module-receiving cavity 53. Module-receiving cavities 43 and 53 are aligned with, and extend from apertures 12 and 13 respectively. Module housing 40 further includes a conventional bayonet receptacle 44 at the end of module-receiving cavity 43. Similarly, module housing 50 further includes a conventional bayonet receptacle 54 at the end of module-receiving cavity 53. Cap unit 16, best seen in FIG. 3, includes a pair of cap segments 18 and 19 which cover and electrically insulate bayonet receptacles 44 and 54. Retainer 17, also better seen in FIG. 3, is fitted upon cap segments 16 and 17 and provides electrical ground connections. Bayonet receptacles 44 and 54 each define a plurality of slots, such as slots 45 and 55 which receive tabs 82 and 83 of terminal connector 80 (seen in FIG. 3).

FIG. 10 sets forth a side elevation view of plug-in module 20. As is described above, plug-in module 20 includes a front face 21 defining a pair of grips 22 and 23. Plug-in module 20 also includes a bayonet cap 28.

FIG. 11 sets forth a front view of plug-in module 20. Plug-in module 20 includes a front face 21 defining a pair of grips 22 and 23. Front face 21 in turn defines a plurality of plug apertures 24, 25 and 26 which are configured to receive a standard three prong plug of the type normally used to plug electrical appliances, or the like, into a conventional wall outlet in order to receive operative electrical power.

FIG. 12 sets forth a rear view of plug-in module 20 showing bayonet cap 28 thereon.

FIG. 13 sets forth a top view of plug-in module 20 showing bayonet cap 28 thereon. Plug-in module 20 includes a front face 21 defining a grip 22.

FIG. 14 sets forth a section view of module 20 taken along section lines 14-14 in FIG. 13. Module 20 supports a plurality of connectors 96, 97 and 98 which provide electrical connection to plug prongs inserted into apertures 24, 25 and 26 respectively. FIG. 14 also shows electronic circuit 29 which provides the electronic function of plug-in module 20.

FIG. 15 sets forth a section view of module 20 taken along section lines 15-15 in FIG. 13. Plug-in module 20 includes a front face 21 having grips 22 and 23 formed thereon. Plug-in module 20 further includes a bayonet cap 28 and a plurality of electrical connectors such as connectors 94 and 95. An electronic circuit 29 is also supported within plug-in module 20.

FIG. 16 sets forth a perspective assembly view of plug-in module 20. As is described above, plug-in module 20 supports a plurality of electrical connectors 96, 97 and 98 which provide electrical connection to the above mentioned three prong plug. Additional connectors 89, 94 and 90 are inserted into bayonet cap 28 through apertures 86 and 87 formed in bayonet cap 28.

FIG. 17 sets forth a side elevation view of plug-in module 30. As is described above, plug-in module 30 includes a front face 31 defining a pair of grips 32 and 33. Plug-in module 30 also includes a bayonet cap 38.

FIG. 18 sets forth a front view of plug-in module 30. Plug-in module 30 includes a front face 31 defining a pair of grips 32 and 33. Front face 31 in turn defines a plurality of USB type plug apertures 34 and 35 which are configured to receive USB plugs. FIG. 12 sets forth a rear view of plug-in module 20 showing bayonet cap 28 thereon.

FIG. 19 sets forth a rear view of plug-in module 30 showing bayonet cap 38 thereon.

FIG. 20 sets forth a top view of plug-in module 30 showing bayonet cap 38 thereon. Plug-in module 30 includes a front face 31 defining a grip 32.

FIG. 21 sets forth a section view of module 30 taken along section lines 21-21 in FIG. 20. Plug-in module 30 includes a front face 31 having grips 32 and 33 formed thereon. Plug-in module 30 further includes a bayonet cap 38 and a plurality of electrical connectors such as connector 66. An electronic circuit 39 is also supported within plug-in module 30.

FIG. 22 sets forth a perspective assembly view of plug-in module 30. As is described above, plug-in module 30 supports a plurality of electrical connectors such as connectors 66 and 67 which provide electrical connection to the above mentioned USB plugs. Connectors 66 and 67 are inserted into bayonet cap 38 through apertures 58 and 59 formed in bayonet cap 38.

Figure 23:
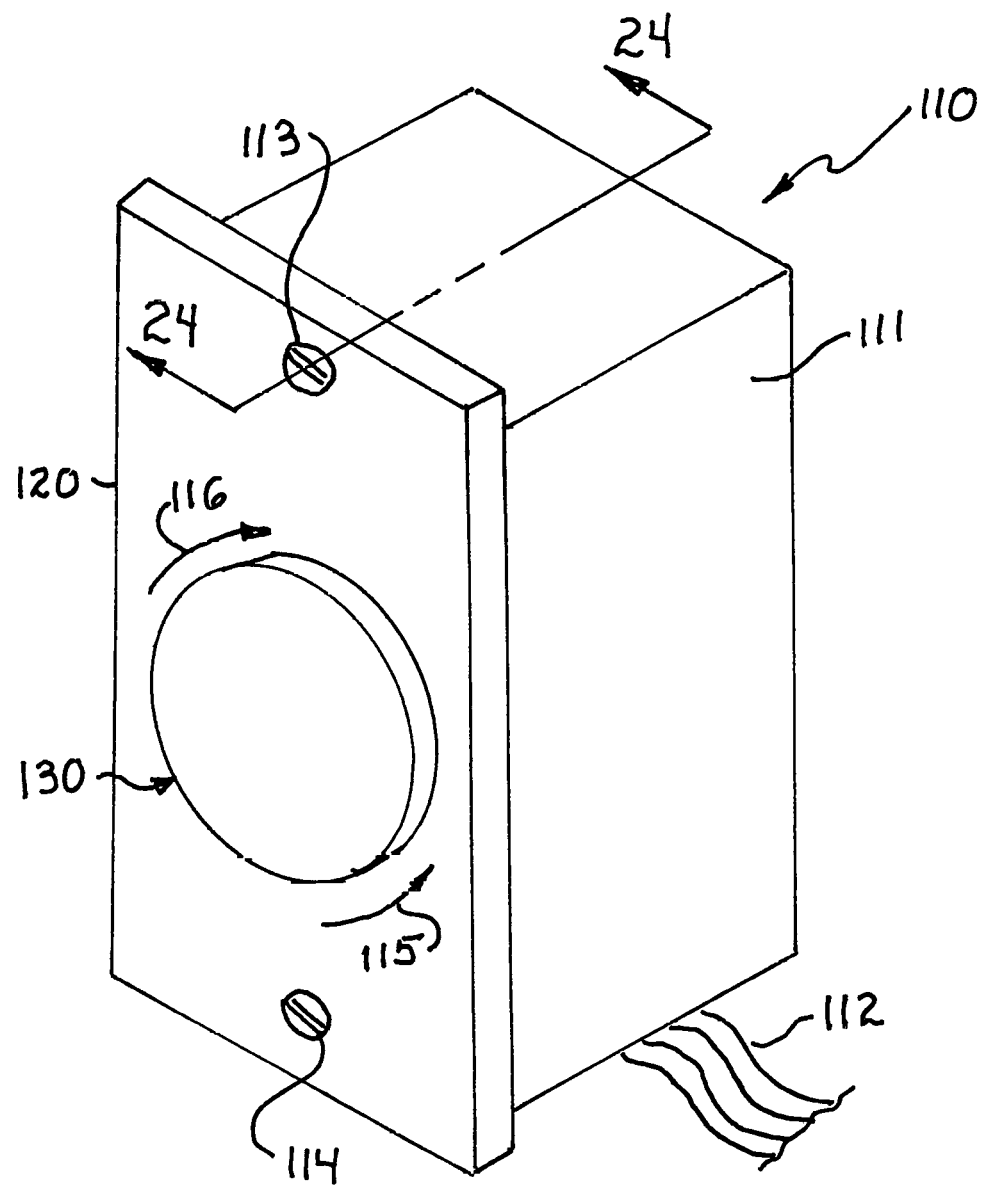
FIG. 23 sets forth a perspective view of an interchangeable electrically powered module and receptacle therefor constructed in accordance with the present invention.

FIG. 23 sets forth a perspective view of an alternate embodiment of the interchangeable electrically powered module and receptacle constructed in accordance with the present invention and generally referenced by numeral 110. Module and receptacle 110 includes a conventional electric back box 111 which is fabricated in accordance with conventional fabrication techniques and is typically supported within a wall and is coupled to a source of electrical power by a plurality of wires 112. Module and receptacle 110 further includes a mounting plate 120 preferably formed of a plastic or other insulating material configured to be received upon electrical back box 111 and secured thereto utilizing a pair of conventional fasteners 113 and 114. In accordance with the present invention, mounting plate 120 defines a female bayonet mount 125 (seen in FIG. 25) within which a module 130 is secured. In accordance with an important aspect of the present invention, module 130 supports a male bayonet mount 135 (seen in FIG. 26) which cooperates with the female bayonet mount of mounting plate 120 to removably secure module 130 in a simple insert and twist bayonet attachment. For purposes of illustration, module 130 will be understood in FIG. 23 to be secured to mounting plate 120 by inserting module 130 into female bayonet mount 125 (seen in FIG. 25) and thereafter turning module 130 in the direction indicated by arrow 116 for a small angle. Conversely, it will be understood that module 130 is readily removed from mounting plate 120 by a small angular rotation in the direction indicated by arrow 115 after which module 130 may be withdrawn. In accordance with an important aspect of the present invention illustrated and described below in greater detail, the bayonet attachment of module 130 to mounting plate 120 performs a physical attachment and an electrical connection to a plurality of connection pads 146, 147 and 148 (seen in FIG. 26) supported on the interior surface of mounting plate 120. By means also shown below in greater detail, electrical power supplied by wires 112 to the interior of electrical back box 11 are provided with electrical connection to these pads allowing module 130 to be powered by its insertion and coupling to bayonet receptacles in mounting plate 120. In further accordance with the present invention described below in greater detail, it will be apparent to those skilled in the art that a plurality of interchangeable modules may be coupled to mounting plate 120 and will thus be supplied with operative electrical power. It is important to note that module 130 is insertable and removable from mounting plate 120 without the need for interrupting the supply of electrical power to module and receptacle 110. This process which is highly efficient is often referred to in the art as "hot-swapping".

Figure 24:
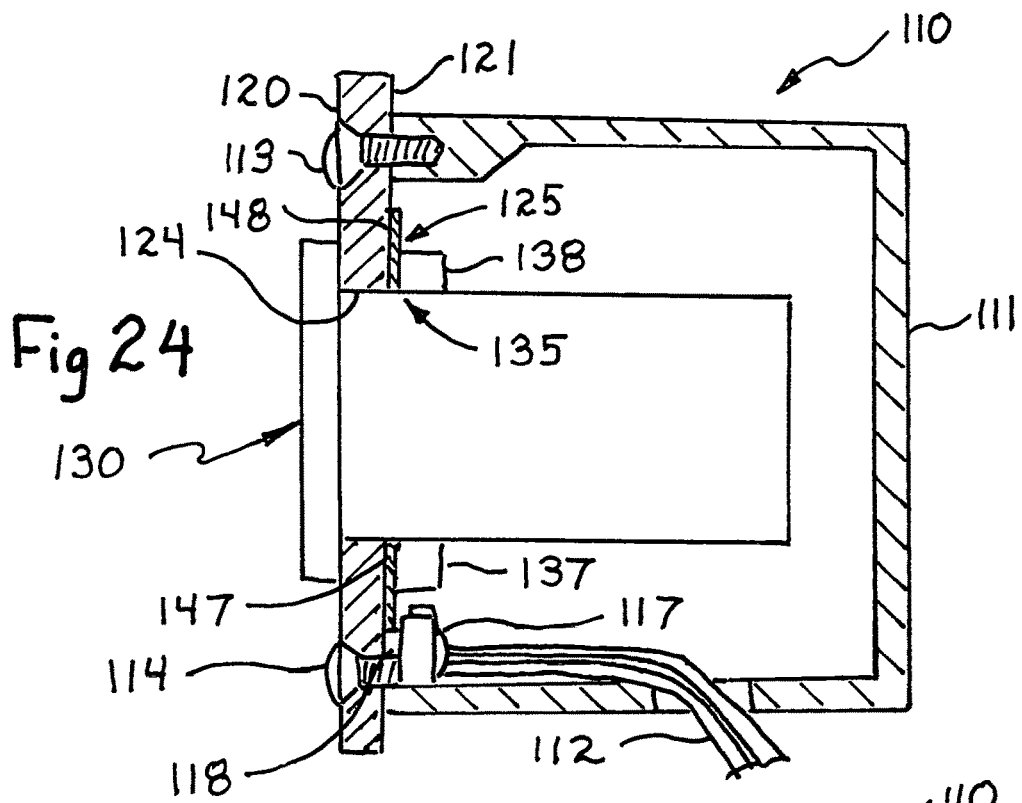
FIG. 24 sets forth a section view of the interchangeable electrically powered module and receptacle therefor set forth in FIG. 23 taken along section lines 24-24 therein.

FIG. 24 sets forth a section view of interchangeable electrically powered module and receptacle 110 taken along section lines 24-24 in FIG. 23. As described above, module and receptacle 110 includes an electrical back box 111 constructed in accordance with the conventional fabrication techniques and typically formed of rigid metal or plastic as desired. In further accordance with conventional fabrication techniques, a plurality of electrical power coupling wires 112 extend through an appropriate aperture formed in back box 111. A mounting plate 120 is secured to back box 111 by a pair of fasteners 113 and 114. As mentioned above, mounting plate 120 defines a female bayonet mount 125 having a plurality of bayonet slots 126, 127 and 128 (seen in FIG. 26) surrounding a central aperture 124. As is also better seen in FIG. 26, female bayonet mount 125 further includes a plurality of connection pads 146, 147 and 148 positioned adjacent to bayonet slots 126, 127 and 128.

A module 130 is inserted into aperture 124 and extends into the interior of electrical back box 111. As mentioned above, and as is set forth below in greater detail, module 130 includes a male bayonet mount 135 having a plurality of bayonet tabs 136, 137 and 138 (seen below in FIGS. 25 and 26). Suffice it to note here that tabs 136, 137 and 138 are positioned about the outer surface of module 130 and in accordance with conventional bayonet mount fabrication techniques are passed through bayonet slots 126, 127 and 128 during insertion of module 130 through aperture 124 and thereafter engage conductive pads 146, 147 and 148 when module 130 is twisted through a small angle to provide bayonet mount engagement. In this manner, electrical connection is made to module 130. Mounting plate 120 defines an interior surface 121 upon which conductive pads 146, 147 and 148 are supported. In addition, surface 121 supports a plurality of connectors 118 (seen in FIG. 26) which are utilized in coupling electrical power connecting wires 112.

Figure 25:
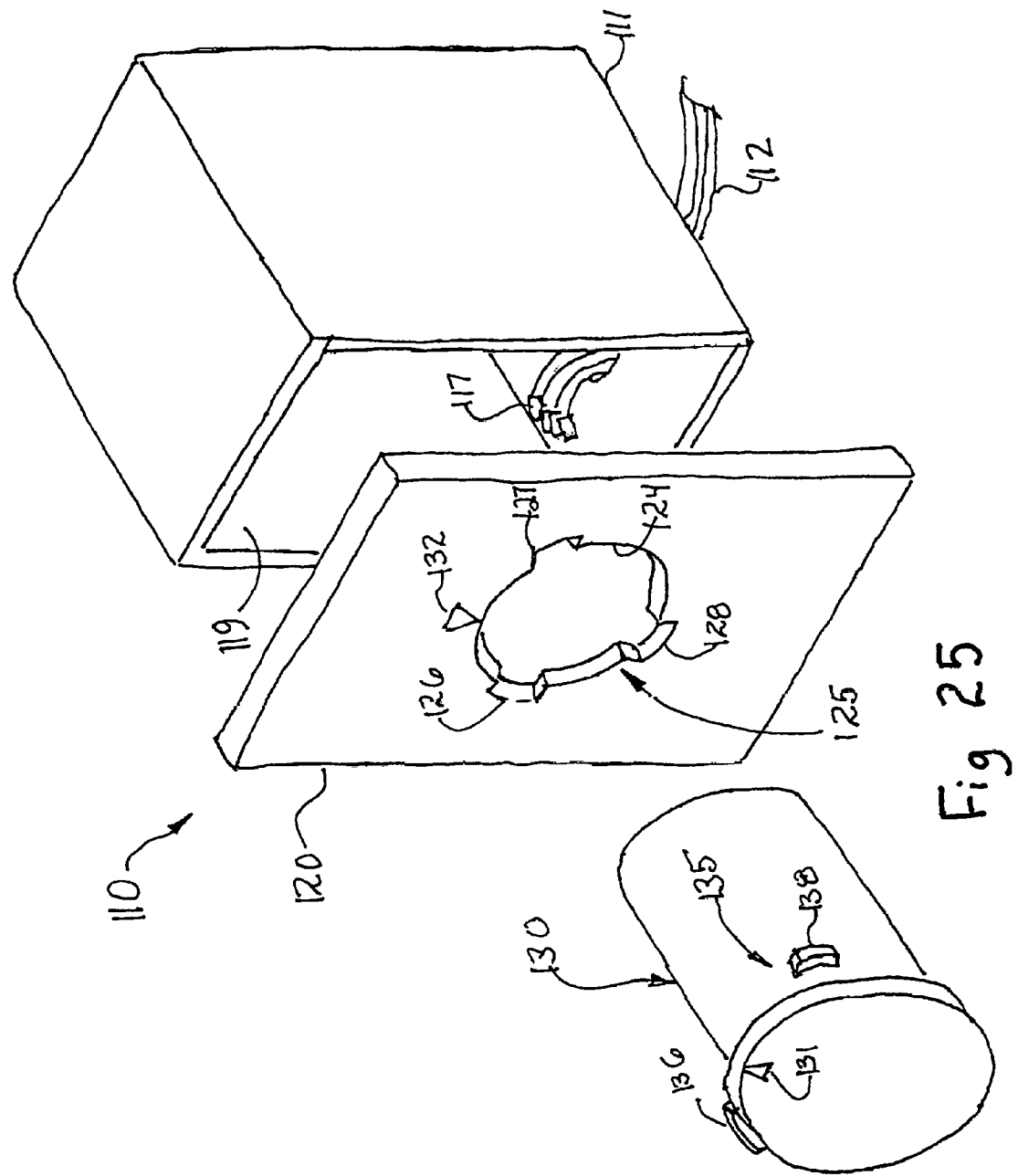
FIG. 25 sets forth a perspective assembly view of the interchangeable electrically powered module and receptacle therefor set forth in FIGS. 23 and 24.

FIG. 25 sets forth a perspective assembly view of interchangeable electrically powered module and receptacle 110. As described above, module and receptacle 110 includes an electric back box 111 defining an open face 119 and an interior which receives a plurality of electrical power coupling wires 112. Electrical power coupling wires 112 further support a plurality of terminals 117. Mounting plate 120 is generally planar in construction and defines a center aperture 124 together with a plurality of bayonet slots 126, 127 and 128 radially spaced about aperture 124. Aperture 124 and slots 126, 127 and 128 combine to form female bayonet mount 125. Module 130 supports an alignment mark 131. Similarly, mounting plate 120 also supports an alignment mark 132. Alignment marks 131 and 132 are used to rotate module 130 to the correct orientation with respect to mounting plate 120 which allows module 130 to be inserted through aperture 124.

Module 130 is receivable within aperture 124 as shown in FIG. 24 and with simultaneous reference to FIGS. 25 and 26 will be seen to include a male bayonet mount 135 having a plurality of bayonet mount tabs 136, 137 and 138.

FIG. 26 sets forth an alternate perspective assembly view of module and receptacle 110. As described above, module and receptacle 110 includes an electric back box 111 which receives a plurality of electrical power coupling wires 112 each terminating in a terminal 117. Mounting plate 120 defines an interior surface 121 and a center aperture 124. A plurality of bayonet slots 126, 127 and 128 are positioned about aperture 124 in an equally spaced arrangement. A plurality of connection pads 146, 147 and 148 are supported upon surface 121 adjacent slots 126, 127 and 128. A plurality of electrical connecters 118 configure to mate with terminals 117 of power wires 112 are supported on surface 121. A plurality of conducting paths 141, 142 and 143 electrically connect connectors 118 to each of connection pads 146, 147 and 148.

Module 130 includes a male bayonet mount 135 having a plurality of bayonet mount tabs 136, 137 and 138 (tabs 137 and 138 seen in FIG. 25).

With simultaneous reference to FIGS. 25 and 26, module and receptacle 110 are assembled by initially connecting terminals 117 to connectors 118 upon mounting plate 120. Thereafter, mounting plate 120 is secured to electrical back box 111 using fasteners 113 and 114 (seen in FIG. 23). Thereafter, the combined structure of electrical back box 111 and mounting plate 120 form a receptacle unit which is configured to be housed within a wall or other convenient structural area within a residence, commercial facility or industrial facility. Once mounting plate 120 is secured to electrical back box 111 and appropriate electrical power connection is made, any of modules provided in present invention system such as module 130 may then be inserted into and mounted to mounting plate 120 in a simple bayonet insertion and small angular rotation. The rotation of module 130 moves bayonet mount tabs 136, 137 and 138 into contact with connection pads 146, 147 and 148 which in turn provides electrical power to the operative circuitry (not shown) housed within module 130. In accordance with an important aspect of the present invention, virtually any module constructed in accordance with the fabrication of module 130 and housing virtually any electronic circuit may be joined to mounting plate 120 and provided with electrical power for operation.

Figure 27:
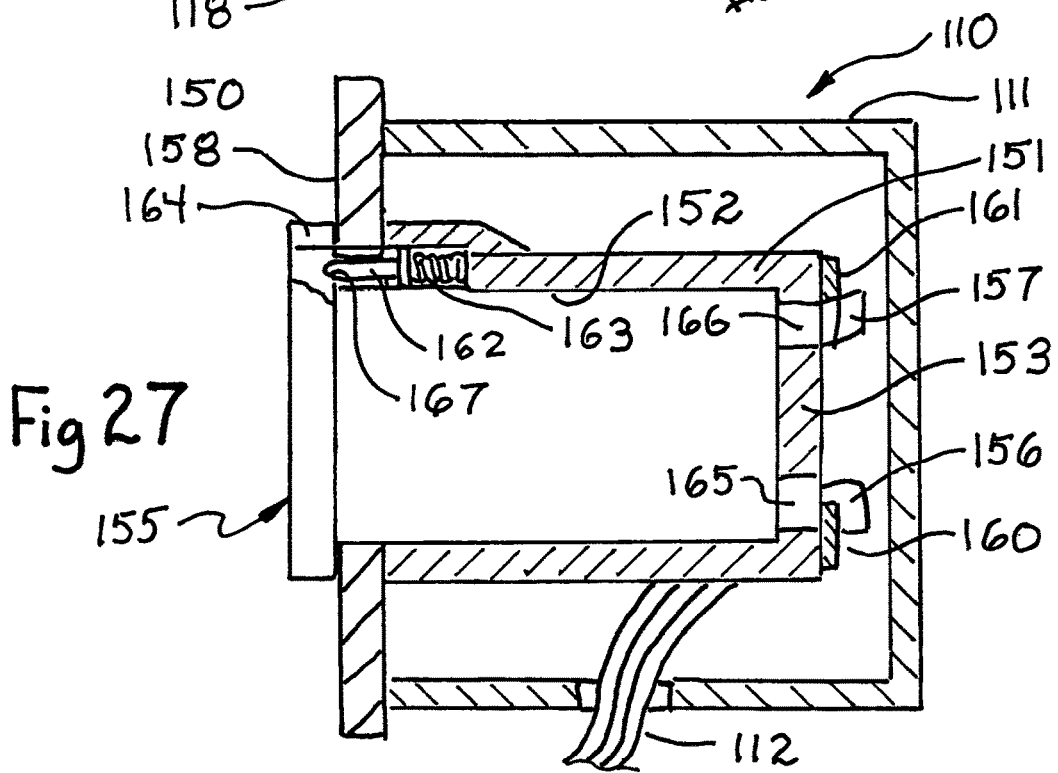
FIG. 27 sets forth a section view of an alternate embodiment of the present invention interchangeable electrically powered module and receptacle therefor.

FIG. 27 sets forth a section view of an alternate embodiment of the present invention in which the bayonet mount apparatus is recessed within the interior of electrical back box 111. More specifically, FIG. 27 sets forth a back box 111 configured in accordance with conventional fabrication techniques and having a plurality of electrical power coupling wires 112 extending to the interior thereof. A mounting plate 150 defines a generally planar front face 158 together with an inwardly extending modular recess 151. Module recess 151 defines a passage 152 and a recess bottom 153. Recess bottom 153 defines a plurality of bayonet slots such as slots 165 and 166. Recess bottom 153 further supports a plurality of connection pads such as connection pads 160 and 161 positioned in proximity to slots 165 and 166. A plurality of power coupling wires 112 extend into the interior of electrical back box 111 and are connected to connection pads 160 and 161.

A module 155 is received within passage 152 of recess 151 and supports a plurality of bayonet mount tabs such as tabs 156 and 157. In accordance with conventional bayonet mount fabrication techniques, module 155 is inserted into passage 152 of module recess 151 such that tabs 156 and 157 are passed through bayonet mount slots 165 and 166. After the insertion of module 155 and the extension of tabs 156 and 157 through slots 165 and 166, module 155 is rotated through a small angular movement causing bayonet mount tabs 156 and 157 to contact connection pads 160 and 161 and thereby provide electrical power for the interior circuitry (not shown) of module 155.

Recess 151 also supports a locking pin 162 and a spring 163. Spring 163 urges pin 162 toward an extended position. The front face of module 155 defines a pin recess 167 which receives the end of locking pin 162 to lock the rotational position of module 155. A pin release 164 is pressed in to disengage locking pin 162 and free module 155. The pin lock and spring release shown in FIG. 27 is typical of all modules and mounting methods used herein.

By way of comparison, FIGS. 24 and 27 set forth alternative embodiments by which the present invention module may be bayonet mounted and connected to the plurality of connecting pads and electrical power provided. It will be apparent to those skilled in the art that the embodiments of the present invention shown in FIGS. 24 and 27 may be utilized in combination or alternatively a plurality of modules fabricated in accordance with either of the embodiments shown in FIG. 24 or 27 may be utilized without departing from the spirit and scope of the present invention.

Figure 28:
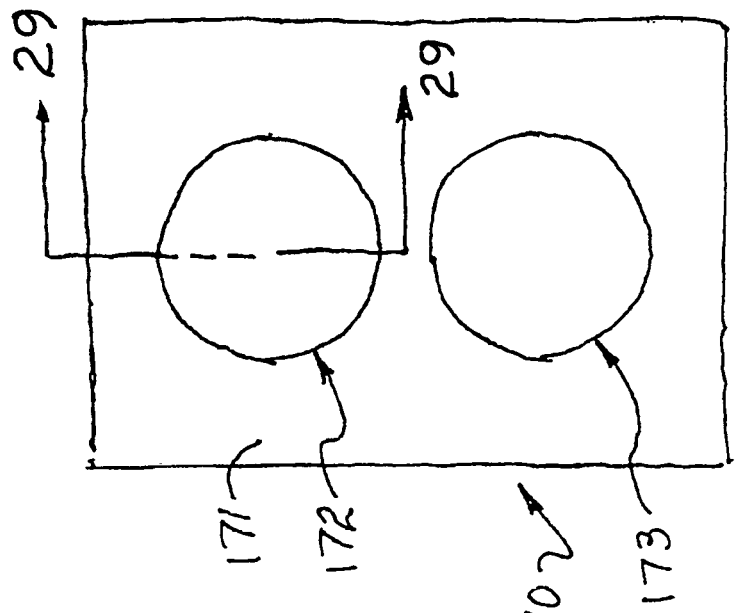
FIG. 28 sets forth a front view of a further alternate embodiment of the present invention interchangeable electrically powered module and receptacle therefor which accommodates a pair of modules.

FIG. 28 sets forth a front view of a further alternate embodiment of the present invention interchangeable electrically powered modules and receptacle generally referenced by numeral 170. Interchangeable electrically powered modules and receptacles 170 illustrates the embodiment of the present invention in which a pair of modules 172 and 173 constructed in accordance with the present invention are secured to a mounting plate 171 also constructed in accordance with the present invention. This configuration known generally as a "double receptacle" provides for a bayonet type mounting and engagement in the manner described above in FIGS. 23 through 27 with the added benefit of providing a pair of modules within a single electric back box. It will be understood that the bayonet mounting of modules 172 and 173 within mounting plate 171 is carried forward in substantially the identical manner as set forth above.

Figure 29:
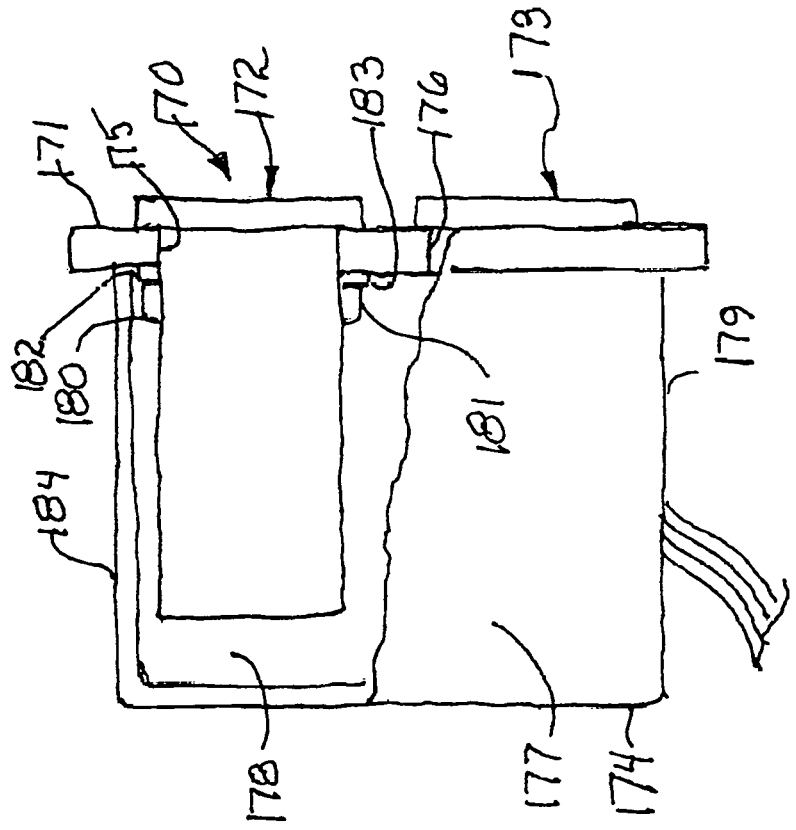
FIG. 29 sets forth a section view of the interchangeable electrically powered module and receptacle therefor shown in FIG. 28 and taken along section lines 29-29 therein.

FIG. 29 sets forth a partial section view of interchangeable electrically powered modules and receptacles 170 taken along section lines 29-29 in FIG. 28. As described above, modules and receptacle 170 includes an electrical back box 174 together with a mounting plate 171. Mounting plate 171 defines a pair of apertures 175 and 176 which receive modules 172 and 173 respectively. Modules 172 and 173 are received within and secured to mounting plate 171 by the above-described bayonet mount system in which electrical connection and power supply is provided by the engagement of a plurality of bayonet mount tabs such as tabs 180 and 181 shown on module 172 within underlying connecting pads such as pads 182 and 183 shown engaging bayonet mount tabs 180 and 181. It will be understood that module 173 is secured by a similar bayonet mount and makes similar electrical connection to the supplied power coupled to the interior of back box 174 by a plurality of power coupling wires 112. It will be noted that electrical back box 174 also includes enclosing side surfaces 177 and 178 together with a bottom surface 179 and a top surface 184. As a result, a pair of modules 172 and 173 is fully enclosed within the enclosure by electrical back box 174 and mounting plate 171.

Figure 30:
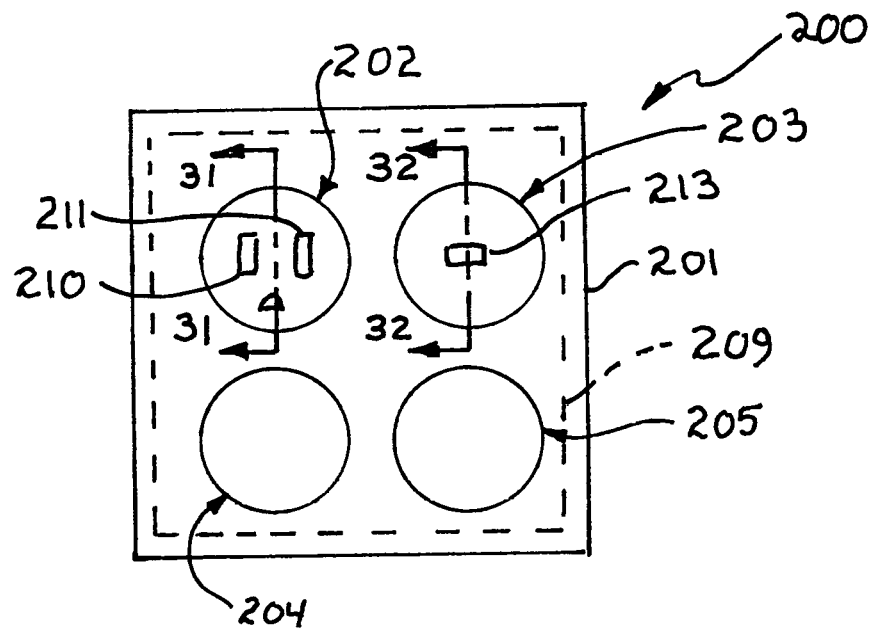
FIG. 30 sets forth a front view of a still further alternate embodiment of the present invention interchangeable electrically powered module and receptacle therefor which accommodates a quartet of modules.

FIG. 30 sets forth a further alternate embodiment of the present invention interchangeable electrically powered modules and receptacles generally referenced by numeral 200. Modules and receptacle 200 is configured to receive a quartet of modules and thus further extends the capacity and capability of the present invention modularized system. In most respects, however, it will be understood that the bayonet mount apparatus utilized in the above-described embodiments is also utilized in the modules and receptacles of the embodiment shown in FIG. 30. Accordingly, modules and receptacle 200 include a generally planar mounting plate 201 which it will be understood is secured to an appropriately sized electrical back box by conventional fasteners (not shown). Mounting plate 201 receives a plurality of modules 202, 203, 204 and 205 all constructed in accordance with the present invention. Modules 202 through 205 are configured to illustrate the variety of module devices which the present invention is capable of supporting. In accordance with an important aspect of the present invention and in a similar fashion to the above-described embodiments, each of modules 202 through 205 will be understood to be configured with a bayonet mount for connecting and supporting with cooperation of mounting plate 201. It will be further apparent to those skilled in the art that the illustrations of different types of devices within each of modules 202 through 205 is provided for illustration and should not in any way be taken as a limitation of the types of devices which the present invention modularized system can accommodate. The important aspect is that each module is independently and interchangeably receivable within mounting plate 201 and is fully self-contained in that it connects to the power source within the supporting electrical back box (not shown) to provide operative power for each module.

Thus, by way of example, module 202 is a power control module utilized in timing and controlling otherwise conventional electric apparatus which is powered by a conventional three-prong plug. Accordingly, module 202 will be seen to support a conventional three-prong plug having blade connections 210 and 211 and a neutral pin connection 212. In the manner set forth below in FIG. 31, the structure by which module 202 functions is set forth. However, suffice it to note here that module 202 utilizing the above-described bayonet mount apparatus is received within a corresponding female bayonet mount structure supported on mounting plate 201. Thus, with module 202 powered, a conventional appliance such as a light, a radio or other apparatus may be plugged into module 202 in a conventional fashion. Module 202 may then be programmed to provide activation of the electrical connections provided to the plugged in appliance in a timer operation or, alternatively, in a wireless control operation as desired.

By way of similar illustration, module 203 is seen to support a USB receptacle 213 fabricated in accordance with conventional fabrication techniques. The configuration of module 203 which provides data and power coupling to USB receptacle 213 is set forth below in FIG. 32 in greater detail. However, suffice it to note here that module 203 having been secured to and actively coupled to the power source within mounting plate 201 is fully powered and fully supported upon mounting plate 201. Accordingly, an otherwise conventional USB connector (not shown) may be inserted into USB receptacle 213 to provide a data and power connection to module 203.

Modules 204 and 205 are configured in accordance with the above-mentioned variety of apparatus and are also received within and supported and powered by mounting plate 201 in the above-mentioned bayonet connection and coupling. It is important to note that interchangeable electrically powered modules and receptacle 200 is configured to fit upon and cooperate with a conventional double-size electrical back box shown in dashed outline 209.

Figure 31:
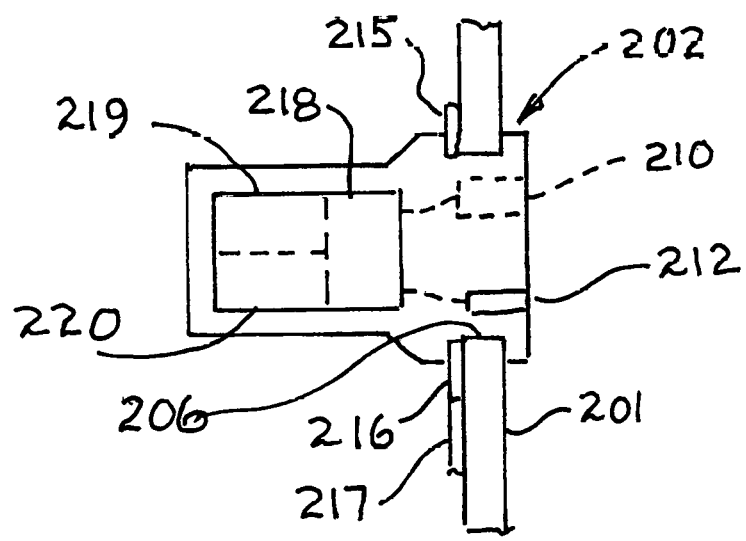
FIG. 31 sets forth a partial section view of the present invention interchangeable electrically powered module and receptacle therefor set forth in FIG. 30 and taken along section lines 31-31 therein.

FIG. 31 sets forth a section view of module 202 supported by mounting plate 201 taken along section lines 31-31 seen in FIG. 30. Mounting plate 201 defines a generally planar covering plate and further defines an aperture 206. The interior surface of mounting plate 201 supports a plurality of electrical connecting pads such as pads 215 and 216. In the manner similar to that described above in FIGS. 25 and 26, it will be understood that connecting pads 215 and 216 are electrically connected by conductive pads formed on the interior surface of plate 201. For purposes of illustration, connecting pad 216 is shown joined to a conductive path 217. It will be understood that each connecting pad within the interior of plate 201 is similarly connected by conductive paths (not shown).

In accordance with the present invention, module 202 defines a plurality of bayonet mounting tabs such as tabs 207 and 208. In accordance with conventional fabrication techniques, mounting plate 201 defines a plurality of elongated slots (not shown) through which mounting tabs 207 and 208 are passed to insert module 202 into engagement with mounting plate 201. In further accordance with conventional bayonet mounting techniques, module 202 is thereafter rotated through a small angle to move bayonet mounting tabs 207 and 208 to overlie and connect to connecting pads 215 and 216. In this manner, electrical power is coupled to the operative system within module 202. As described above, module 202 is utilized in controlling the operation of an otherwise conventional appliance. As is also described above, to facilitate this coupling, module 202 supports a conventionally arranged three-connector plug receptacle set. In FIG. 31, blade receptacle 210 and pin receptacle 212 are seen. Module 202 further includes a power coupling circuit 218 operatively coupled to blade receptacles 210 and 211 (seen in FIG. 30) as well as neutral pin receptacle 212. In addition, module 202 further includes a wireless control having conventional wireless circuit capability for receiving command or data signals and utilizing such signals in operating power coupler 218. By further conventional fabrication techniques, module 202 further includes a programmable timer circuit 219 which is also operatively coupled to power coupler 218. Accordingly, the combined operation of module 202 provides for the selective application of operational electrical power to the receptacle supported on the front face of module 202. This control utilizes as need programmable timer 219 or wireless control 220.

Figure 32:
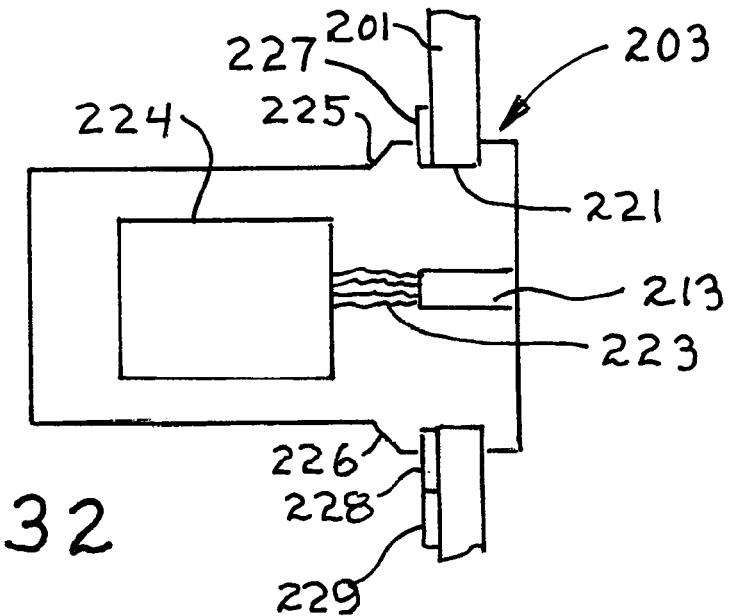
FIG. 32 sets forth a partial section view of the present invention interchangeable electrically powered module and receptacle therefor set forth in FIG. 30 and taken along section lines 32-32 therein.

FIG. 32 sets forth a partial section view of module 203 taken along section lines 32-32 in FIG. 30. As mentioned above, module 203 supports a USB receptacle 213 on the front face thereof. In accordance with the above-described bayonet mount fabrication techniques, module 203 further includes a plurality of bayonet mount tabs such as tabs 225 and 226. Mounting plate 201 further supports a plurality of connecting pads such as pads 227 and 228. Pad 228 is shown coupled to a source of operative electrical power (not shown). In accordance with the above-described bayonet mount techniques, module 203 is received within aperture 221 by aligning tabs 225 and 226 with the bayonet mounts formed on mounting plate 201 (not shown). Once module 203 has been inserted through aperture 221, module 203 is rotated through a small angle to cause bayonet mounting tabs 225 and 226 to overlie and engage connecting paths 227 and 228. For purposes of illustration, module 203 is shown supporting an internal USB controller 224 which is operatively coupled to USB receptacle 213 by a plurality of connecting wires 223. USB controller 224 is illustrative of a virtually endless variety of control apparatus and data processing apparatus which may be utilized within module 203. The important aspect of module 203 is to illustrate the flexibility of the present invention system. Of particular interest in FIG. 32 is the capability of coupling USB controller 224 to an external USB device through receptacle 213. Once again, operative power is provided for USB controller 224 by the bayonet mount and connecting pads such as connecting pads 227 and 228 together with connecting paths such as connecting path 229.

Figure 33:
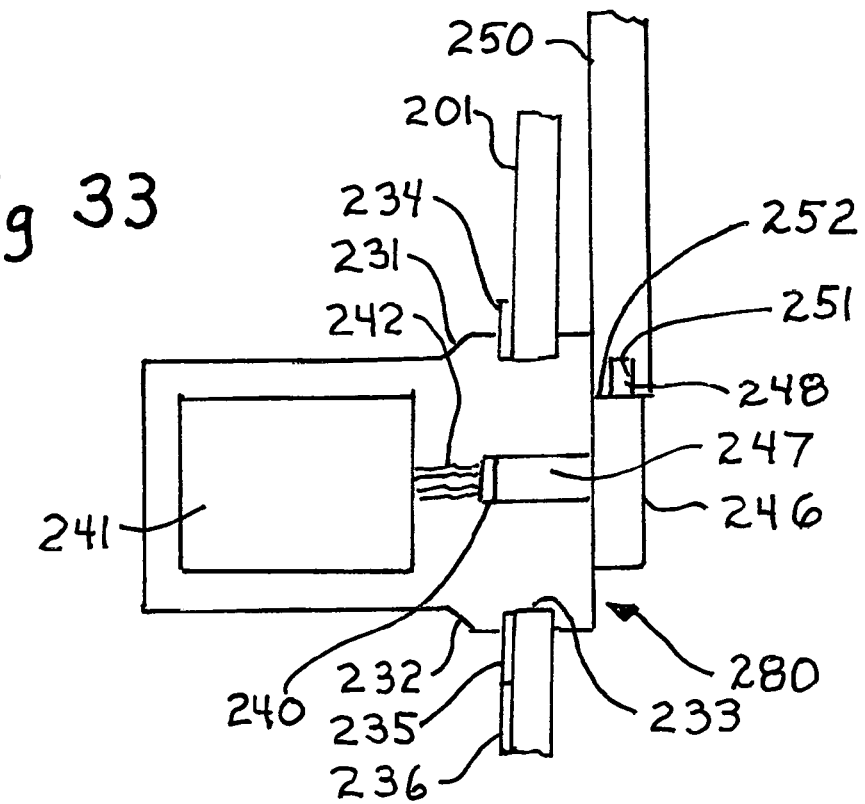
FIG. 33 sets forth a partial section view of a still further alternate embodiment of the present invention interchangeable electrically powered module and receptacle therefor.

FIG. 33 sets forth partial section view of a still further alternate embodiment of the present invention in which a "module in module" variation is described. Thus, FIG. 33 shows a partial section view of mounting plate 201 having an aperture 233 formed therein. Mounting plate 201 further supports a plurality of bayonet mounting slots (not shown) together with a plurality of electrical connecting pads 234 and 235. For purposes of illustration, the power coupling for connecting pads such as pads 234 and 235 is shown as connecting path 236. A bayonet mounted module 280 constructed in accordance with the above-described fabrication techniques is passed through aperture 233 by aligning bayonet mounting tabs 231 and 232 with the appropriate bayonet slots formed in plate 201 (not shown) and thereafter rotating module 280 through a small angle. Module 280 further includes a controller 241 and a USB port 240. Port 240 is coupled to controller 241 by a plurality of coupling wires 242. In accordance with the module in module concept of the embodiment shown in FIG. 33, a further smaller module 246 supporting a USB plug 247 is received within USB port 240. With module 246 received within module 280, USB plug 247 is operatively inserted into USB socket 240 to secure module 246. By way of example, module 246 defines an upper support surface 252 from which a male connector 248 extends upwardly. While not seen in FIG. 33, it will be understood that connector 248 is electrically coupled to controller 241 via USB plug 247 and wires 242. It will be further understood that operative power such as power utilized in charging device batteries is provided by controller 241 through the same coupling. Accordingly, a conventional digital electronic device 250 having a female port 251 therein may be positioned as shown in FIG. 33 such that port 251 receives male connector 248 and such that the bottom edge of device 250 rests upon support surface 252 of module 246. In this manner, controller 241 may for example communicate with device 250 and simultaneously or separately provide battery charging power via connector 248.

It will be apparent to those skilled in the art that the above-described modules are merely illustrative of a virtually endless variety of module devices which may be configured in accordance with the above-described operation and structure. Accordingly, it will be apparent to practitioners in the art that different additional examples for the above-described modules may be envisioned without departing from the spirit and scope of the present invention in its broader aspects.

The dimensions and appearance of the face or exposed portion of each module may vary depending on the function of each module. By way of example, a module with the function of a PTZ security camera may present an exposed surface that has a larger diameter and that extends farther outside the mounting plate, as compared to the exposed surface dimensional specifications of a module with the function of an electrical receptacle or USB charging port.

It will be apparent to those skilled in the art that a variety of function modules of differing types may be utilized without departing from the spirit and scope of the present invention. For example, a USB charging port is utilized, the function of which is to reduce the line current voltage and amperage sufficiently to charge the batteries of electronic devices such as cell phones, tablet computers, and other electronic devices via cable with a standard USB plug (male) at one end and various types (including, but not limited to, standard USB, Apple Thunderbolt, HDMI/micro HDMI, Firewire, micro USB).

Additionally, a USB data port is utilized, the function of which is to accomplish data transfer and device communication. Also, 120 volt/15 ampere receptacle that is automated/wirelessly controlled by various current wireless protocols including, but not limited to, Zigbee, Z-wave, Insteon, Bluetooth, and yet to be developed protocols may be utilized in the inventive modules. By way of further example, a 120 volt/15 ampere receptacle that includes a timer function, which timer is programmable wirelessly (current and yet to be developed wireless protocols) via computer or cell phone, and is also capable of manual programming. Further examples include a wireless network (Wi-Fi) extender which includes an ethernet port of various types (including, but not limited to, RJ-45 and USB) that also allows the extender to function as a bridge for connecting home theater components; task light/night light with wireless (of aforementioned protocols) and manual control and programming a security camera (stationary, pan/tilt and pan/tilt/zoom) of various manufacture and wireless control protocol: audio speaker/intercoms that are connected (either wirelessly via aforementioned protocols, conventionally by internal electrical wiring, or directly with a USB cable) to a home entertainment system, cell phone, computer or similar device, and a motion detector that is wirelessly controlled, programmed and monitored may be utilized.

It will be noted that while the primary method of mounting modules to modular device receptacles, and of transferring power from a receptacle/mounting plate to a module is obtained with a bayonet mount connection as described herein, alternate mounting and power transfer can be obtained by various other means. Examples of alternative means include but are not limited to audio type jacks, including RCA type, secured with a Chicago screw; audio type jacks, including RCA type, secured with a DZUS type fastener; and twist-lock type (NEMA configuration) connectors including, but not limited to, representative types of connections by Hubble (Hubblelock), Omega (PT Series Connectors), Molex (MX150), Pass & Seymour pin and sleeve connector, BNC type, and other similar connectors.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. Interchangeable electrically powered plug-in modules and receptacles therefor comprising:
   at least one module receptacle having a front plate defining a front surface and a rear surface;
   a plurality of module receiving apertures defined in said front plate;
   a plurality of module housings each aligned with one of said apertures and each extending from said rear surface and each defining a rearward end;
   a plurality of attachment receptacles supported at each of said rearward ends;
   a plurality of plug-in modules each having a front face, an elongated cylindrical body and an attachment end, said attachment ends configured to engage said attachment receptacles; and a functional electrically powered circuit supported within each of said plug-in modules,
   said plug-in modules being interchangeable among said module housings and operative therein.

2. The interchangeable electrically powered plug-in modules and receptacles therefor set forth in claim 1 wherein said plurality of plug-in modules include an electrical power plug receptacle having a plurality of plug apertures, formed in said front face, configured to receive a standard electrical appliance power plug.

3. The interchangeable electrically powered plug-in modules and receptacles therefor set forth in claim 1 wherein said plurality of plug-in modules include a power control module for controlling an electrical appliance.

4. The interchangeable electrically powered plug-in modules and receptacles therefor set forth in claim 1 wherein said plurality of plug-in modules include a USB module module having a USB receptacle in said front face and providing data and power coupling to said USB receptacle.

5. The interchangeable electrically powered plug-in modules and receptacles therefor set forth in claim 1 wherein said plurality of plug-in modules include an appliance timer and controller having an electric power coupling circuit, a timer and a wireless control.

6. The interchangeable electrically powered plug-in modules and receptacles therefor set forth in claim 1 further including rotational interlocks operative between said attachment receptacles and said attachment ends cooperating to latch the rotational positions of said plug-in modules.

7. Electrically powered plug-in modules and receptacles therefor comprising:
   a module receptacle having a front plate defining a front surface and a rear surface;
   a pair of module receiving apertures defined in said front plate;
   a pair of module housings each aligned with one of said apertures and each extending from said rear surface and each defining a rearward end;
   a pair of attachment receptacles supported at each of said rearward ends;
   a plurality of plug-in modules each having a front face, an elongated cylindrical body and an attachment end, said attachment ends configured to engage said attachment receptacles; and a functional electrically powered circuit supported within each of said plug-in modules,
   said plug-in modules being interchangeable among said module housings and operative therein.

8. The interchangeable electrically powered plug-in modules and receptacles therefor set forth in claim 7 wherein said plurality of plug-in modules include an electrical power plug receptacle having a plurality of plug apertures, formed in said front face, configured to receive a standard electrical appliance power plug.

9. The interchangeable electrically powered plug-in modules and receptacles therefor set forth in claim 7 wherein said plurality of plug-in modules include a power control module for controlling an electrical appliance.

10. The interchangeable electrically powered plug-in modules and receptacles therefor set forth in claim 7 wherein said plurality of plug-in modules include a USB module module having a USB receptacle in said front face and providing data and power coupling to said USB receptacle.

11. The interchangeable electrically powered plug-in modules and receptacles therefor set forth in claim 7 wherein said plurality of plug-in modules include an appliance timer and controller having an electric power coupling circuit, a timer and a wireless control.

12. The interchangeable electrically powered plug-in modules and receptacles therefor set forth in claim 7 further including rotational interlocks operative between said attachment receptacles and said attachment ends cooperating to latch the rotational positions of said plug-in modules.

* * * * *